US012733337B2

(12) United States Patent
Bae et al.

(10) Patent No.: US 12,733,337 B2
(45) Date of Patent: Sep. 8, 2026

(54) METHOD FOR MANUFACTURING A DISPLAY DEVICE

(71) Applicant: SAMSUNG DISPLAY CO., LTD., Yongin-si (KR)

(72) Inventors: Joon Woo Bae, Yongin-si (KR); Guanghai Jin, Yongin-si (KR); Sam Tae Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 395 days.

(21) Appl. No.: 18/419,727

(22) Filed: Jan. 23, 2024

(65) Prior Publication Data

US 2024/0423018 A1 Dec. 19, 2024

(30) Foreign Application Priority Data

Jun. 16, 2023 (KR) ........................ 10-2023-0077354

(51) Int. Cl.

*H10K 59/12* (2023.01)
*H10K 59/122* (2023.01)
*H10K 59/80* (2023.01)
*H10K 71/00* (2023.01)
*H10K 71/60* (2023.01)

(52) U.S. Cl.

CPC ....... *H10K 59/1201* (2023.02); *H10K 59/122* (2023.02); *H10K 59/873* (2023.02); *H10K 71/60* (2023.02); *H10K 71/621* (2023.02)

(58) Field of Classification Search

CPC ............. H10K 59/1201; H10K 59/122; H10K 59/873; H10K 71/60; H10K 71/621; H10K 59/8731; H10K 59/131; H10K 59/95; H10K 59/40; H10W 90/00
USPC ............................................................ 438/99
See application file for complete search history.

(56) References Cited

U.S. PATENT DOCUMENTS

2021/0193787 A1* 6/2021 Won ........................ H10K 59/40
2023/0393680 A1* 12/2023 Bae ........................ G06F 3/0412

FOREIGN PATENT DOCUMENTS

KR 10-1814014 1/2018

* cited by examiner

*Primary Examiner* — Tong-Ho Kim
(74) *Attorney, Agent, or Firm* — F. CHAU & ASSOCIATES, LLC

(57) ABSTRACT

A method for manufacturing a display device, the display device including: a substrate including a display area and a sub area at a side of the display area; a plurality of light emitting elements on the substrate in the display area; a first dam on the substrate and between the plurality of light emitting elements and the sub area; a bank structure on the substrate and in the sub area; and a first valley between the first dam and the bank structure, wherein the method includes: forming a first metal layer including a first metal in the first valley; forming a step compensator on the first metal layer in the first valley; forming a photoresist layer on the first metal layer and the step compensator; forming a photoresist pattern by patterning the photoresist layer; and forming a first electrode by patterning the first metal layer using the photoresist pattern.

20 Claims, 17 Drawing Sheets

FIG. 5

DA
NDA
SBA
VAL1
VAL2
PRL
BNK3
BNK2
BNK1
BNK
SDAM2
SDAM3
SDAM1
DAM2
DAM1
ED1
AE1 EL1 CE1
CPE
CNE1
DE ACT GE SE BML
TFT
MTL1
SIL2
SIL1
TFE3
TFE2
TFE1
TFEL
BKL
PAS2
CNE2
PAS1
ILD2
ILD1
GI
BF2
BF1
SUB
TFTL

FIG. 10

FIG. 14
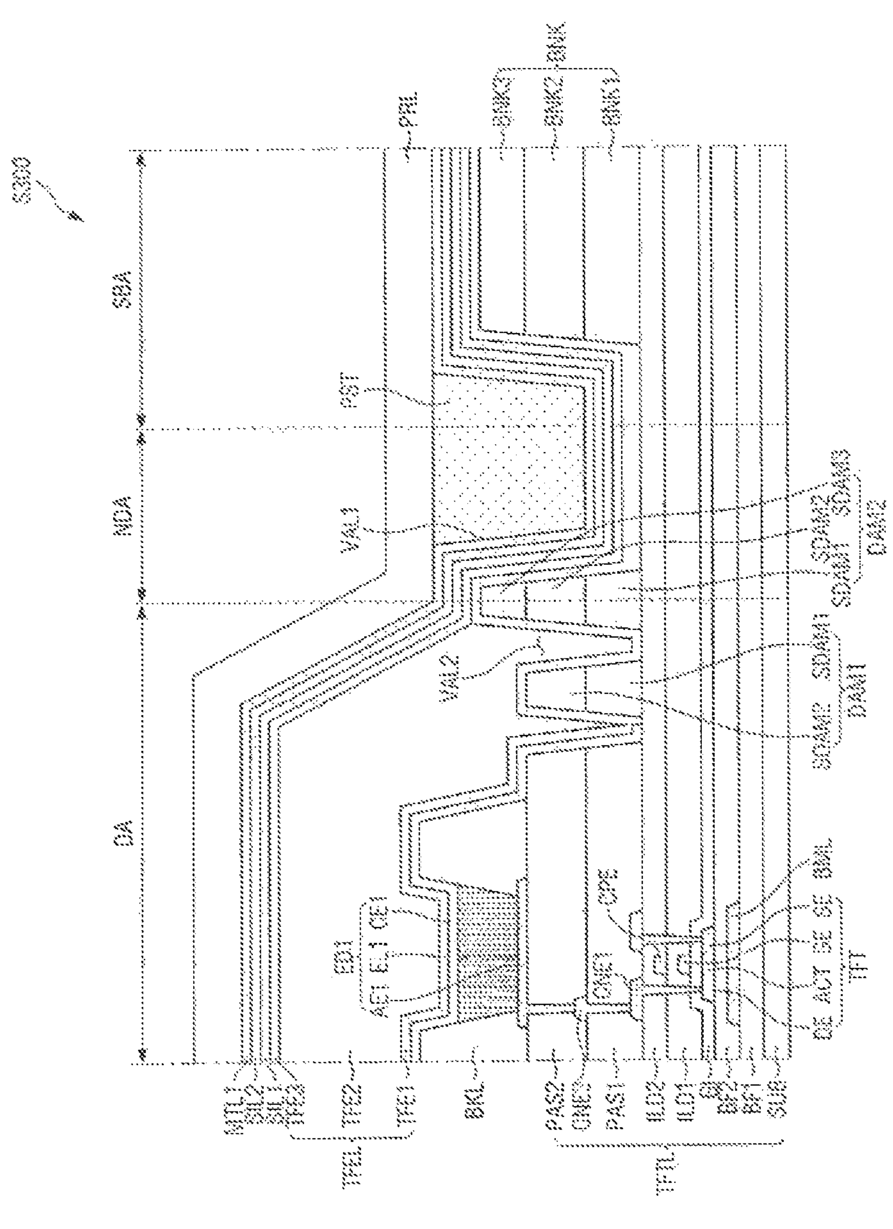
S300
DA
NDA
SBA
PRL
BNK3
BNK2
BNK1
BNK
PST
VAL1
VAL2
SDAM1
SDAM2
SDAM3
DAM1
DAM2
ED1
CPE
CNE1
TFT
TFE2
TFE1
BKL
PAS2
CNE2
PAS1
ILD2
ILD1
SUB
TFEL
TFTL

METHOD FOR MANUFACTURING A DISPLAY DEVICE

CROSS-REFERENCE TO RELATED APPLICATION

This application claims priority under 35 U.S.C. § 119 to Korean Patent Application No. 10-2023-0077354 filed on Jun. 16, 2023, in the Korean Intellectual Property Office, the disclosure of which is incorporated by reference herein in its entirety.

1. Technical Field

The present disclosure relates to a method for manufacturing a display device.

2. Description of the Related Art

As multimedia technology evolves, the significance of display devices continues to grow. Consequently, a diverse range of display devices, including liquid-crystal display devices (LCDs) and organic light-emitting diode display devices (OLEDs), are undergoing rapid development.

Among display devices, self-luminous display devices are characterized by the inclusion of self-luminous elements. A self-luminous element typically consists of two opposing electrodes and a light emitting layer interposed therebetween. In the case of an organic light-emitting element, which serves as a self-luminous element, electrons and holes from the electrodes recombine within the light emitting layer, leading to the creation of excitons. These excitons transition from the excited state to the ground state, resulting in light emission. However, such an organic light-emitting element is vulnerable to oxygen and moisture. To mitigate this vulnerability, an encapsulation structure is often employed to prevent the permeation of oxygen and moisture.

To prevent the organic material included in the encapsulation structure from overflowing into a non-display area or a sub-region due to over-saturation of the organic material formed in the display area, at least one dam can be formed. In addition, a bank structure may be formed in the sub-region to protect the lines that extend from the display area to the sub-region. These dams and the bank structure are often significantly tall, creating a valley-like space between them.

SUMMARY

Embodiments of the present disclosure provide a method for manufacturing a display device that minimizes the residue of a metal layer in a valley between a dam and a bank structure when the metal layer is formed on the dam, the bank structure and the valley.

According to an embodiment of the present disclosure, there is provided a method for manufacturing a display device, the display device including: a substrate including a display area and a sub area disposed at a side of the display area; a plurality of light emitting elements disposed on the substrate in the display area; a first dam disposed on the substrate and disposed between the plurality of light emitting elements and the sub area; a bank structure disposed on the substrate and disposed in the sub area; and a first valley disposed between the first dam and the bank structure, the method includes: forming a first metal layer including a first metal in the first valley; forming a step compensator on the first metal layer in the first valley; forming a photoresist layer on the first metal layer and the step compensator; forming a photoresist pattern by patterning the photoresist layer; and forming a first electrode by patterning the first metal layer using the photoresist pattern.

The step compensator includes the first metal.

In the forming of the first electrode, the step compensator is removed along with patterning the first metal layer.

The step compensator is etched by an etchant used to etch the first metal layer.

In the forming of the step compensator, upper surfaces of the first metal layer and the step compensator are positioned at the same height.

In the forming of the photoresist pattern, the photoresist layer is formed to be flat in the first valley.

In the forming of the photoresist pattern, the photoresist pattern is not disposed on the first valley.

In the forming of the first electrode, the first electrode or the first metal layer is not disposed on the first valley.

The display device further include a thin film encapsulation layer disposed on the plurality of light emitting elements, the thin film encapsulation layer includes a first encapsulation layer, a second encapsulation layer disposed on the first encapsulation layer, and a third encapsulation layer disposed on the second encapsulation layer, and the second encapsulation layer is not disposed in the first valley.

A second dam is further disposed on the substrate and disposed between the first dam and the plurality of light emitting elements; and a second valley is disposed between the first dam and the second dam, the step compensator is further formed in the second valley.

The display device further includes a thin film encapsulation layer disposed on the plurality of light emitting elements, the thin film encapsulation layer includes a first encapsulation layer, a second encapsulation layer disposed on the first encapsulation layer, and a third encapsulation layer disposed on the second encapsulation layer, and the second encapsulation layer is not disposed in the second valley.

The step compensator is formed by applying a paste in a screen printing method.

According to an embodiment of the present disclosure, there is provided a method for manufacturing a display device, the display device including: a substrate; a plurality of light emitting elements disposed on the substrate; a first dam disposed on the substrate and disposed at a side of the plurality of light emitting elements; a second dam disposed on the substrate and disposed at a side of the first dam; and a valley disposed between the first dam and the second dam, wherein the method includes: forming a first metal layer including a first metal in the valley; forming a step compensator on the first metal layer in the valley; forming a photoresist layer on the first metal layer and the step compensator; forming a photoresist pattern by patterning the photoresist layer; and forming a first electrode by patterning the first metal layer using the photoresist pattern.

The step compensator includes the first metal.

In the forming of the first electrode, the step compensator is removed with the patterning of the first metal layer.

The step compensator is etched by an etchant used to etch the first metal layer.

In the forming of the step compensator, upper surfaces of the first metal layer and the step compensator are positioned at the same height.

In the forming of the photoresist layer, the photoresist layer is formed to be flat in the valley.

The photoresist pattern is not disposed in the valley.

The first electrode or the first metal layer is not disposed in the valley.

According to an embodiment of the present disclosure, when the metal layer is formed on the dam, the bank structure, and the valley, it is possible to minimize the residue of the metal layer in the valley.

BRIEF DESCRIPTION OF THE DRAWINGS

The above and other features of the present disclosure will become more apparent by describing in detail embodiments thereof with reference to the attached drawings, in which:

FIG. 5 is a cross-sectional view illustrating a portion of a display device according to an embodiment;

FIGS. 8, 9 and 10 are cross-sectional views illustrating some steps of a method for manufacturing a display device according to a conventional example;

FIG. 14 is a cross-sectional view showing step S300 of FIG. 11;

DETAILED DESCRIPTION OF THE EMBODIMENTS

The present disclosure will now be described more fully hereinafter with reference to the accompanying drawings, in which embodiments thereof are shown. This disclosure may, however, be embodied in different forms and should not be construed as limited to the embodiments set forth herein.

It will be understood that when a layer is referred to as being "on" another layer or substrate, it can be directly on the other layer or substrate, or intervening layers may also be present. The same reference numbers may indicate the same components throughout the specification.

Figure 1:
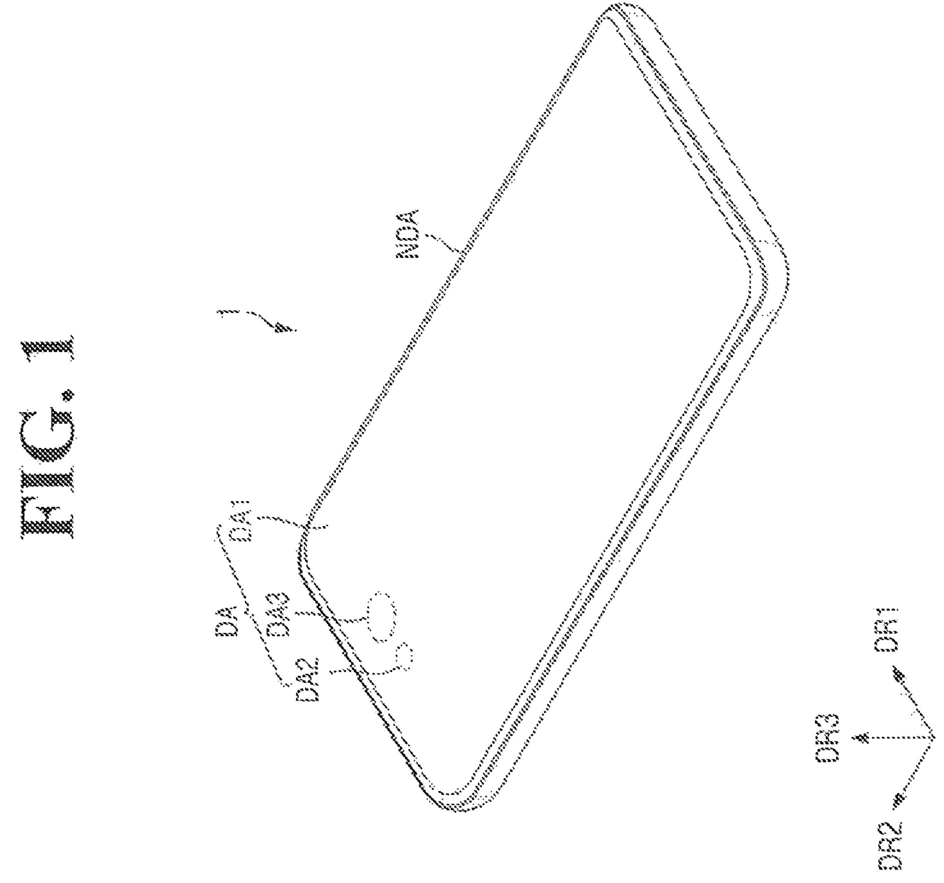
FIG. 1 is a perspective view of an electronic device according to an embodiment.

FIG. 1 is a perspective view of an electronic device according to an embodiment.

Referring to FIG. 1, an electronic device 1 displays a moving image or a still image. The electronic device 1 may refer to any electronic device having a display screen. Examples of the electronic device 1 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like.

Figure 2:
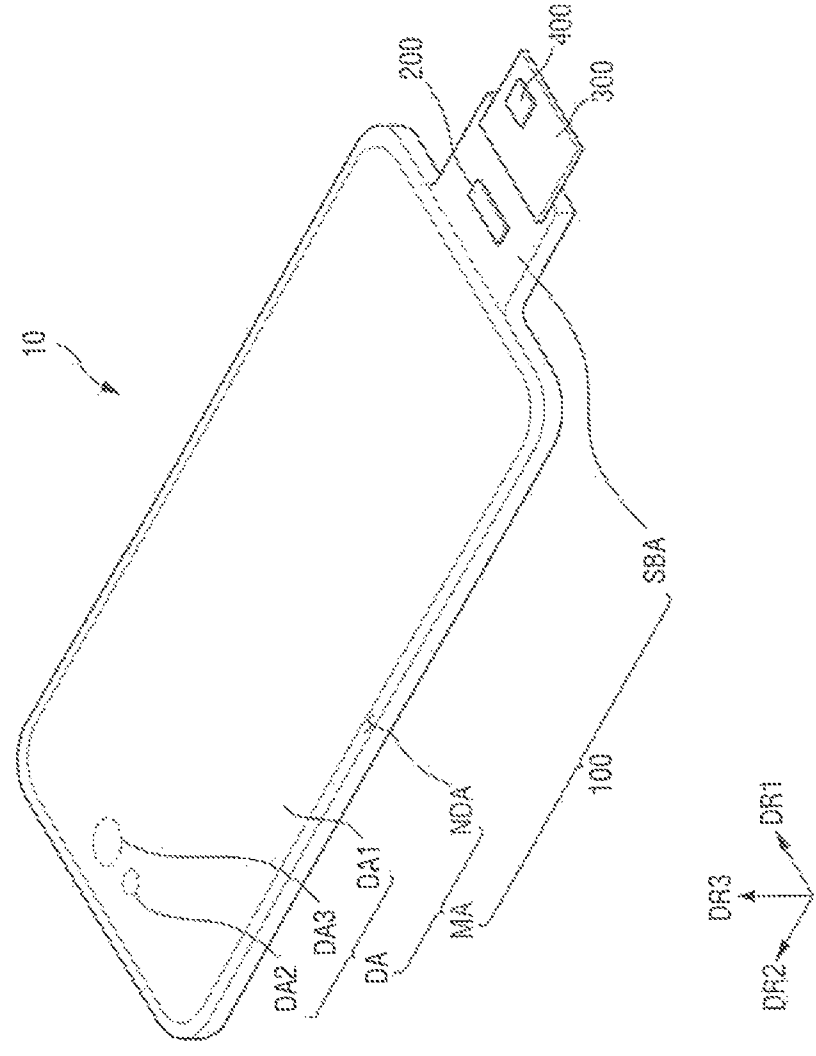
FIG. 2 is a perspective view illustrating a display device included in an electronic device according to an embodiment.

The electronic device 1 may include a display device 10 in FIG. 2 which has a display screen. Examples of the display device may include an inorganic light emitting diode display device, an organic light emitting display device, a quantum dot light emitting display device, a plasma display device and a field emission display device. In the following description, a case where an organic light emitting diode display device is employed as a display device will be described, but the present disclosure is not limited thereto, and other display devices may be applied.

The shape of the electronic device 1 may be variously modified. For example, the electronic device 1 may have a shape such as a rectangular shape elongated in a horizontal direction, a rectangular shape elongated in a vertical direction, a square shape, a quadrilateral shape with rounded corners (e.g., vertices), other polygonal shapes and a circular shape. The shape of a display area DA of the electronic device 1 may also be similar to the overall shape of the electronic device 1. FIG. 1 illustrates the electronic device 1 having a rectangular shape elongated in a second direction DR2.

In FIG. 1, a first direction DR1 and the second direction DR2 are horizontal directions and intersect each other. For example, the first direction DR1 and the second direction DR2 may be orthogonal to each other. In addition, a third direction DR3 may be a vertical direction intersecting the first direction DR1 and the second direction DR2. For example, the third direction DR3 may be orthogonal to the first direction DR1 and the second direction DR2. In the present specification, directions indicated by arrows in the first to third directions DR1, DR2, and DR3 may be referred to as one side, and the opposite direction thereof may be referred to as the other side.

The electronic device 1 may include the display area DA and a non-display area NDA. The display area DA is an area where a screen (or image) can be displayed, and the non-display area NDA is an area where a screen (or image) is not displayed. The display area DA may also be referred to as an active region, and the non-display area NDA may also be referred to as a non-active region. The display area DA may substantially occupy the center of the electronic device 1.

The display area DA may include a first display area DA1, a second display area DA2 and a third display area DA3. In the second display area DA2 and the third display area DA3, components for adding a variety of features to the electronic device 1 may be disposed. In other words, the second display area DA2 and the third display area DA3 may be referred to as component areas. The first display area DA1 is substantially larger than each of the second and third display areas DA2 and DA3.

FIG. 2 is a perspective view illustrating a display device included in an electronic device according to an embodiment.

Referring to FIG. 2, the electronic device 1 according to one embodiment may include a display device 10. The display device 10 may provide a screen (or image) displayed by the electronic device 1. The display device 10 may have a planar shape similar to the shape of the electronic device 1. For example, the display device 10 may have a shape similar to a rectangular shape having a short side in the first direction DR1 and a long side in the second direction DR2. The edge where the short side in the first direction DR1 and the long side in the second direction DR2 meet may be rounded to have a curvature, but is not limited thereto and may be formed at a right angle. The planar shape of the display device 10 is not limited to a quadrilateral shape, and may be formed in a shape similar to another polygonal shape, a circular shape, or elliptical shape.

The display device 10 may include a display panel 100, a display driver 200, a circuit board 300, and a touch driver 400.

The display panel 100 may include a main region MA and a sub-region SBA.

The main region MA may include the display area DA including pixels for displaying an image and the non-display area NDA disposed around the display area DA. The display area DA may include a first display area DA1, a second display area DA2 and a third display area DA3. The display area DA may emit light from a plurality of opening areas or a plurality of emission areas. For example, the display panel 100 may include a pixel circuit including switching elements, a pixel defining layer defining an emission area or an opening area, and a self-light emitting element.

For example, the self-light emitting element may include at least one of an organic light emitting diode (LED) including an organic light emitting layer, a quantum dot LED including a quantum dot light emitting layer, an inorganic LED including an inorganic semiconductor, or a micro LED, but is not limited thereto.

The non-display area NDA may be an area outside the display area DA. The non-display area NDA may be an edge area of the main region MA of the display panel 100. The non-display area NDA may include a gate driver 210 (see FIG. 4) that supplies gate signals to gate lines, and fan-out lines FOL (see FIG. 4) that connect the display driver 200 to the display area DA.

The sub-region SBA may be a region extending from one side of the main region MA. The sub-region SBA may include a flexible material which can be bent, folded or rolled. For example, when the sub-region SBA is bent, the sub-region SBA may overlap the main region MA in a thickness direction (third direction DR3). The sub-region SBA may include the display driver 200 and a pad unit connected to the circuit board 300. In another embodiment, the sub-region SBA may be omitted, and the display driver 200 and the pad unit may be arranged in the non-display area NDA.

The display driver 200 may output signals and voltages for driving the display panel 100. The display driver 200 may supply data voltages to data lines. The display driver 200 may supply a power voltage to a power line and may supply a gate control signal to the gate driver 210 (see FIG. 4). The display driver 200 may be formed as an integrated circuit (IC) and mounted on the display panel 100 by a chip on glass (COG) method, a chip on plastic (COP) method, or an ultrasonic bonding method. For example, the display driver 200 may be disposed in the sub-region SBA, and may overlap the main region MA in the thickness direction by bending of the sub-region SBA. As another example, the display driver 200 may be mounted on the circuit board 300.

The circuit board 300 may be attached to the pad unit of the display panel 100 by using an adhesive member. For example, the adhesive member may be a non-conductive film (NCF). As another example, the adhesive member may be an anisotropic conductive film (ACF) or a self-assembly anisotropic conductive paste (SAP).

Lead lines of the circuit board 300 may be electrically connected to the pad unit of the display panel 100. The circuit board 300 may be a flexible film such as a flexible printed circuit board, a printed circuit board, or a chip on film.

The touch driver 400 may be mounted on the circuit board 300. The touch driver 400 may be connected to a touch sensing unit of the display panel 100. The touch driver 400 may supply a touch driving signal to a plurality of touch electrodes of the touch sensing unit and may sense an amount of change in capacitance between the plurality of touch electrodes. For example, the touch driving signal may be a pulse signal having a predetermined frequency. The touch driver 400 may calculate whether an input is made and determine input coordinates based on an amount of change in capacitance between the plurality of touch electrodes. The touch driver 400 may be formed of an integrated circuit (IC).

Figure 3:
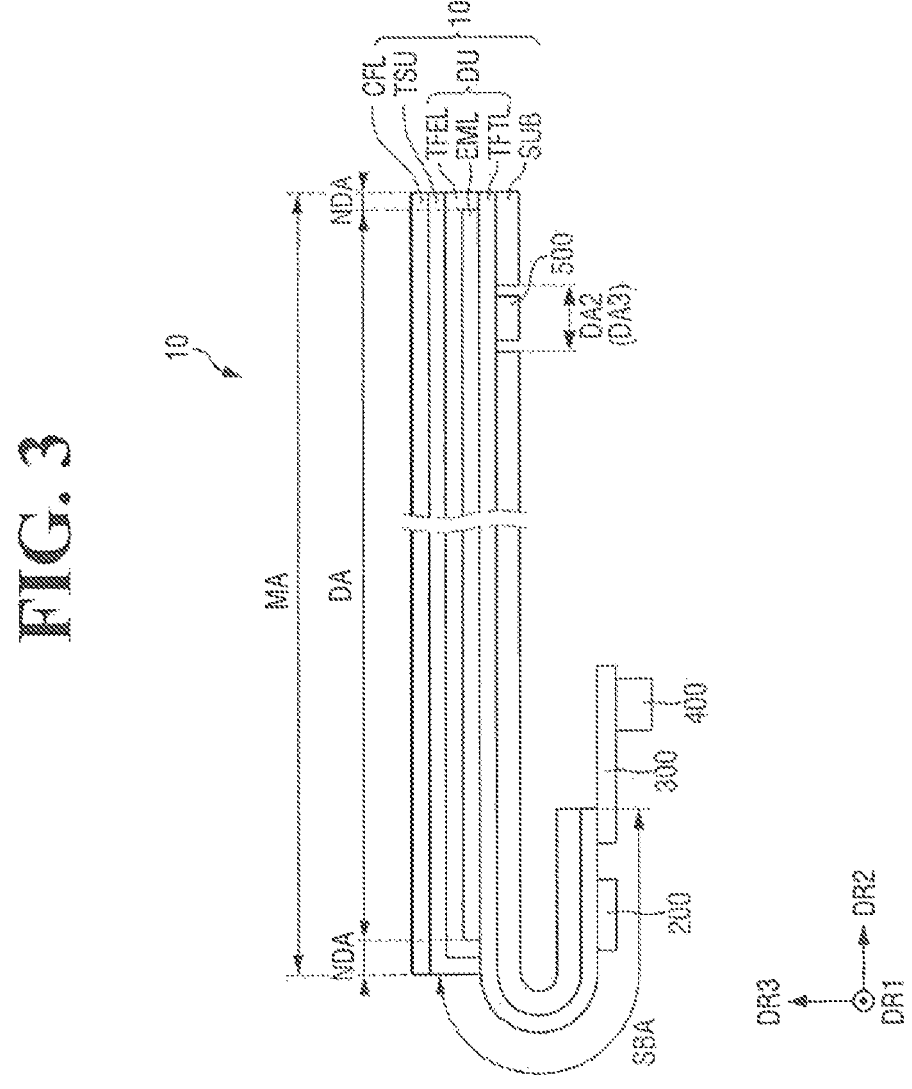
FIG. 3 is a cross-sectional view of a display device according to an embodiment.

FIG. 3 is a cross-sectional view of a display device according to an embodiment.

Referring to FIG. 3, the display panel 100 may include a substrate SUB, a display layer DU, a touch sensing layer TSU (e.g., touch layer), and a color filter layer CFL. The display layer DU may include a thin film transistor layer TFTL (e.g., circuit layer), the light emitting element layer EML, and a thin film encapsulation layer TFEL.

The substrate SUB may be a base substrate or a base member. The substrate SUB may be a flexible substrate which can be bent, folded or rolled. For example, the substrate SUB may include a polymer resin such as polyimide (PI), but is not limited thereto. In another embodiment, the substrate SUB may include a glass material or a metal material.

The thin film transistor layer TFTL may be disposed on the substrate SUB. The thin film transistor layer TFTL may include a plurality of thin film transistors constituting a pixel circuit of pixels. The thin film transistor layer TFTL may further include gate lines GL (sec FIG. 4), data lines DL (see FIG. 4), power lines VL (see FIG. 4), gate control lines GCL (sec FIG. 4), and the fan-out lines FOL (see FIG. 4) for connecting the display driver 200 and the data lines DL, and lead lines for connecting the display driver 200 and the pad unit. Each of the thin film transistors may include a semiconductor area, a source electrode, a drain electrode, and a gate electrode. For example, when the gate driver 210 (see FIG. 4) is formed on one side of the non-display area NDA of the display panel 100, the gate driver 210 (see FIG. 4) may include the thin film transistors.

The thin film transistor layer TFTL may be disposed in the display area DA, the non-display area NDA, and the sub-region SBA. Thin film transistors, gate lines GL, data lines DL, and power lines VL of each of the pixels of the thin film transistor layer TFTL illustrated in FIG. 4 may be disposed in the display area DA. Gate control lines GCL and fan-out lines FOL of the thin film transistor layer TFTL illustrated in FIG. 4 may be disposed in the non-display area NDA. The lead lines of the thin film transistor layer TFTL may be disposed in the sub-region SBA.

The light emitting element layer EML may be disposed on the thin film transistor layer TFTL. The light emitting element layer EML may include a plurality of light emitting elements each including a first electrode, a second electrode, and a light emitting layer to emit light, and a pixel defining layer defining pixels. The plurality of light emitting elements of the light emitting element layer EML may be disposed in the display area DA.

The thin film encapsulation layer TFEL may cover the top surface and the side surface of the light emitting element layer EML, and may protect the light emitting element layer EML. The thin film encapsulation layer TFEL may contact the thin film transistor layer TFTL at the sides of the light emitting element layer EML. The thin film encapsulation layer TFEL may include at least one inorganic layer and at least one organic layer for encapsulating the light emitting element layer EML.

The touch sensing layer TSU may be disposed directly on the thin film encapsulation layer TFEL. The touch sensing layer TSU may include a plurality of touch electrodes for sensing a user's touch in a capacitive manner, and touch lines connecting the plurality of touch electrodes to the touch driver 400. For example, the touch sensing layer TSU may sense the user's touch by using a mutual capacitance method or a self-capacitance method. The touch sensing layer TSU may further sense touch of a electronic pen or proximity of the user, for example.

In another embodiment, the touch sensing layer TSU may be disposed on a separate substrate disposed on the display layer DU. In this case, the substrate supporting the touch sensing layer TSU may be a base member that encapsulates the display layer DU.

The plurality of touch electrodes of the touch sensing layer TSU may be disposed in a touch sensor area overlapping the display area DA. The touch lines of the touch sensing layer TSU may be disposed in a touch peripheral area that overlaps the non-display area NDA.

The color filter layer CFL may be disposed on the touch sensing layer TSU. The color filter layer CFL may be disposed directly on the touch sensing layer TSU. The color filter layer CFL may include a plurality of color filters respectively corresponding to the plurality of emission areas. Each of the color filters CFL may selectively transmit light of a specific wavelength and may block or absorb light of a different wavelength. The color filter layer CFL may absorb a part of light coming from the outside of the display device 10 to reduce reflected light due to external light. Accordingly, the color filter layer CFL may prevent color distortion caused by the reflection of the external light.

Since the color filter layer CFL is directly disposed on the touch sensing layer TSU, the display device 10 may not require a separate substrate for the color filter layer CFL. Therefore, the thickness of the display device 10 may be relatively small.

Figure 4:
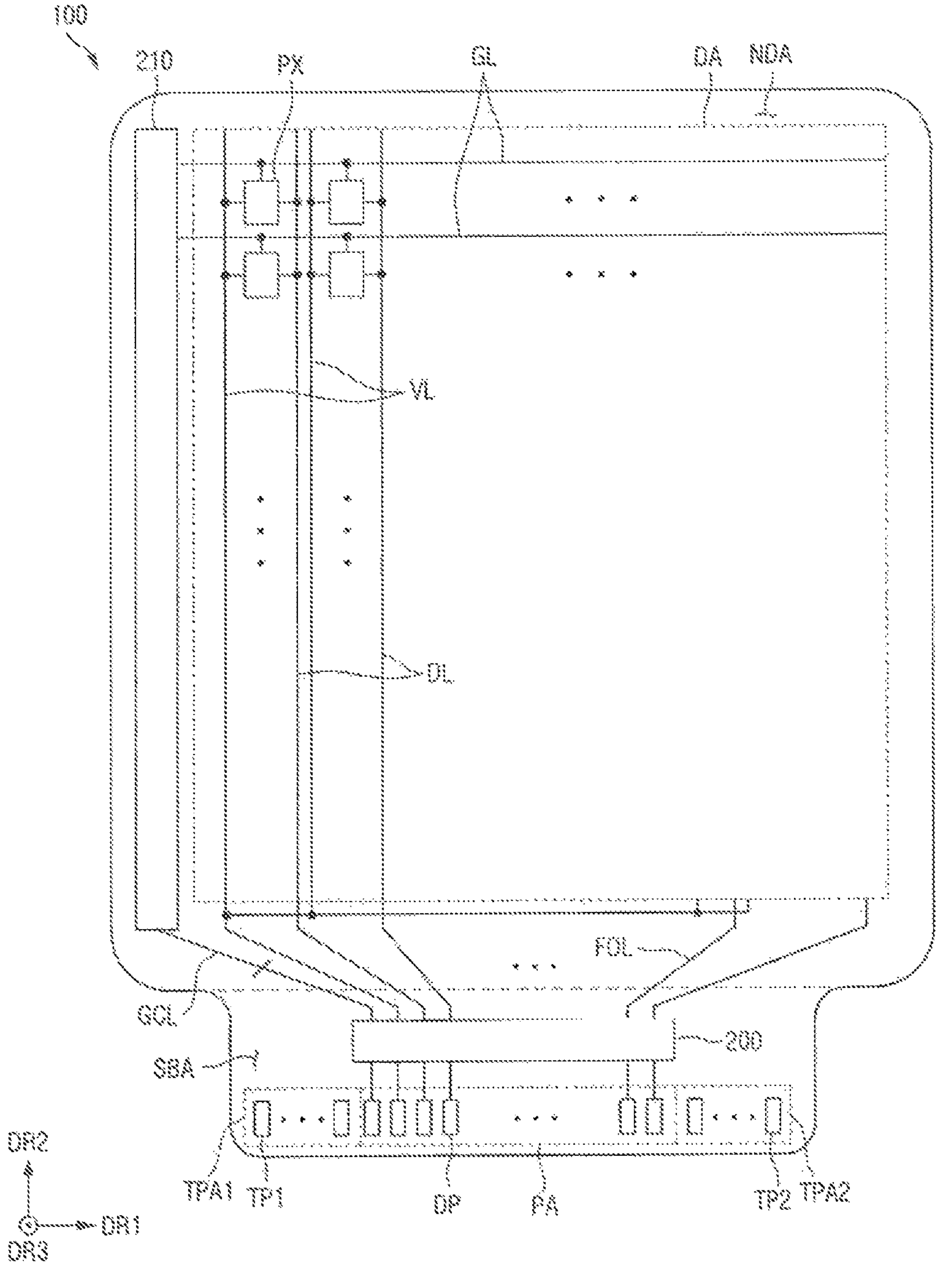
FIG. 4 is a plan view illustrating a display layer of a display device according to an embodiment.

FIG. 4 is a plan view illustrating a display layer of a display device according to an embodiment.

Referring to FIG. 4, the display panel 100 may include the display area DA and the non-display area NDA.

The display area DA may be disposed at the center of the display panel 100. In the display area DA, a plurality of pixels PX, a plurality of gate lines GL, a plurality of data lines DL, and a plurality of power lines VL may be disposed. Each of the plurality of pixels PX may be the smallest unit that emits light.

The plurality of gate lines GL may supply the gate signals received from the gate driver 210 to the plurality of pixels PX. The plurality of gate lines GL may extend in the first direction DR1 and may be spaced apart from each other in the second direction DR2 intersecting the first direction DR1.

The plurality of data lines DL may supply the data voltages received from the display driver 200 to the plurality of pixels PX. The plurality of data lines DL may extend in the second direction DR2 and may be spaced apart from each other in the first direction DR1.

The plurality of power lines VL may supply the power voltage received from the display driver 200 to the plurality of pixels PX. Here, the power voltage may be at least one of a driving voltage, an initialization voltage, a reference voltage, or a low potential voltage. The plurality of power lines VL may extend in the second direction DR2 and may be spaced apart from each other in the first direction DR1. The plurality of power lines VL may be arranged in parallel with the plurality of data lines DL.

The non-display area NDA may surround the display area DA. The gate driver 210, fan-out lines FOL, and gate control line GCL may be disposed in the non-display area NDA. The gate driver 210 may generate a plurality of gate signals based on the gate control signal, and may sequentially supply the plurality of gate signals to the plurality of gate lines GL according to a set order.

The fan-out lines FOL may extend from the display driver 200 to the display area DA. The fan-out lines FOL may supply the data voltage received from the display driver 200 to the plurality of data lines DL.

The gate control line GCL may extend from the display driver 200 to the gate driver 210. The gate control line GCL may supply the gate control signal received from the display driver 200 to the gate driver 210.

The sub-region SBA may include the display driver 200, a pad area PA, and first and second touch pad areas TPA1 and TPA2.

The display driver 200 may output signals and voltages for driving the display panel 100 to the fan-out lines FOL. The display driver 200 may supply a data voltage to the data line DL through the fan-out lines FOL. The data voltage may be supplied to the plurality of pixels PX, and the luminance of the plurality of pixels PX may be controlled. The display driver 200 may supply the gate control signal to the gate driver 210 through the gate control line GCL.

The pad area PA, the first touch pad area TPA1, and the second touch pad area TPA2 may be disposed at the edge of the sub-region SBA. The pad area PA may be located between the first touch pad area TPA1, and the second touch pad area TPA2. The pad area PA, the first touch pad area TPA1, and the second touch pad area TPA2 may be electrically connected to the circuit board 300 by using an adhesive member.

The pad area PA may include a plurality of display pad units DP. The plurality of display pad units DP may be connected to a graphic system through the circuit board 300. The plurality of display pad units DP may be connected to the circuit board 300 to receive digital video data, and may supply the digital video data to the display driver 200.

The first and second touch pad areas TPA1 and TPA2 may include a plurality of first and second touch pad units TP1 and TP2, respectively. The plurality of first and second touch pad units TP1 and TP2 may be connected to the touch driver 400 through the circuit board 300. The plurality of first and second touch pad units TP1 and TP2 may be connected to the touch driver 400 through the circuit board 300 to receive touch driving signals.

Figure 5:
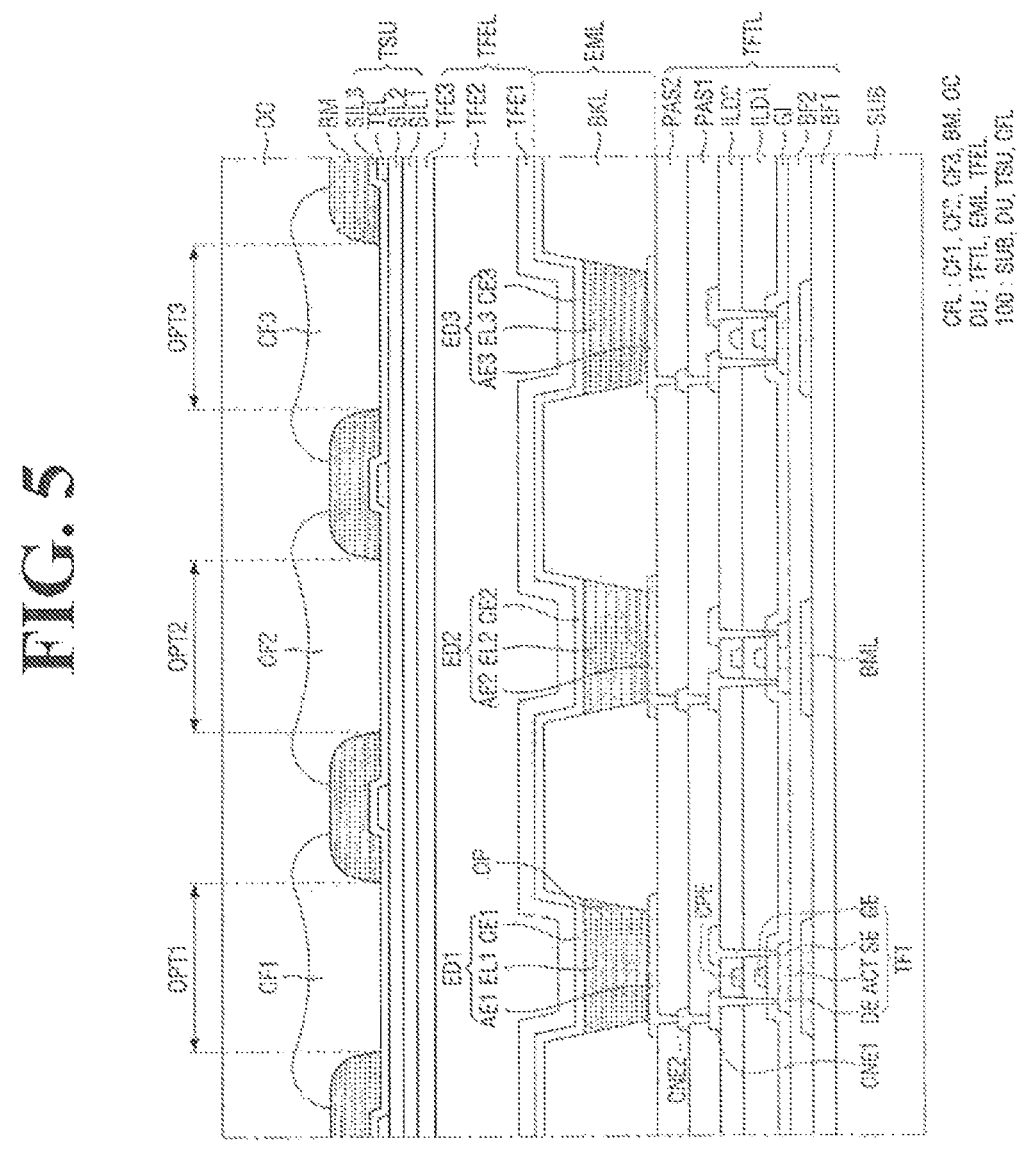

FIG. 5 is a cross-sectional view illustrating a portion of a display device according to an embodiment.

Referring to FIG. 5, the display panel 100 of the display device 10 may include a substrate SUB, a display layer DU, a touch sensing layer TSU and a color filter layer CFL. The display layer DU may include a thin film transistor layer TFTL, a light emitting element layer EML, and a thin film encapsulation layer TFEL.

The substrate SUB may be a base substrate or a base member. The substrate SUB may be a flexible substrate which can be bent, folded or rolled. For example, the substrate SUB may include a polymer resin such as polyimide (PI), but is not limited thereto. As another example, the substrate SUB may include a glass material or a metal material.

The thin film transistor layer TFTL may include a first buffer layer BF1, a lower metal layer BML, a second buffer layer BF2, a thin film transistor TFT, a gate insulating layer GI, a first interlayer insulating layer ILD1, a capacitor electrode CPE, a second interlayer insulating layer ILD2, a first connection electrode CNE1, a first passivation layer PAS1, a second connection electrode CNE2, and a second passivation layer PAS2.

The first buffer layer BF1 may be disposed on the substrate SUB. The first buffer layer BF1 may include an inorganic layer capable of preventing the penetration of air or moisture. For example, the first buffer layer BF1 may include a plurality of inorganic layers alternately stacked.

The lower metal layer BML may be disposed on the first buffer layer BF1. The lower metal layer BML may include a material that blocks light to prevent light from being incident on a semiconductor layer ACT. For example, the lower metal layer BML may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. In some embodiments, the lower metal layer BML may be omitted.

The second buffer layer BF2 may cover the first buffer layer BF1 and the lower metal layer BML. The second buffer layer BF2 may include an inorganic layer capable of preventing the penetration of air or moisture. For example, the second buffer layer BF2 may include a plurality of inorganic layers alternately stacked.

The thin film transistor TFT may be disposed on the second buffer layer BF2, and may constitute a pixel circuit of each of a plurality of pixels. For example, the thin film transistor TFT may be a switching transistor or a driving transistor of the pixel circuit. The thin film transistor TFT may include a semiconductor layer ACT, a source electrode SE, a drain electrode DE, and a gate electrode GE.

The semiconductor layer ACT may be disposed on the second buffer layer BF2. The semiconductor layer ACT may overlap the lower metal layer BML and the gate electrode GE in the thickness direction, and may be insulated from the gate electrode GE by the gate insulating layer GI. The second buffer layer BF2 may be located between the semiconductor layer ACT and the lower metal layer BML. In a part of the semiconductor layer ACT, a material of the semiconductor layer ACT may be made into a conductor to form the source electrode SE and the drain electrode DE.

The gate electrode GE may be disposed on the gate insulating layer GI. The gate electrode GE may overlap the semiconductor layer ACT with the gate insulating layer GI interposed therebetween.

The gate insulating layer GI may be disposed on the semiconductor layer ACT. For example, the gate insulating layer GI may cover the semiconductor layer ACT and the second buffer layer BF2 to insulate the gate electrode GE from the semiconductor layer ACT. The gate insulating layer GI may include a contact hole through which the first connection electrode CNE1 passes. The first connection electrode CNE1 may be contact with the drain electrode DE.

The first interlayer insulating layer ILD1 may cover the gate electrode GE and the gate insulating layer GI. The first interlayer insulating layer ILD1 may include a contact hole through which the first connection electrode CNE1 passes. The contact hole of the first interlayer insulating layer ILD1 may be connected to the contact hole of the gate insulating layer GI and the contact hole of the second interlayer insulating layer ILD2.

The capacitor electrode CPE may be disposed on the first interlayer insulating layer ILD1. The capacitor electrode CPE may overlap the gate electrode GE in the thickness direction. The capacitor electrode CPE and the gate electrode GE may form a capacitance.

The second interlayer insulating layer ILD2 may cover the capacitor electrode CPE and the first interlayer insulating layer ILD1. The second interlayer insulating layer ILD2 may include a contact hole through which the first connection electrode CNE1 passes. The contact hole of the second interlayer insulating layer ILD2 may be connected to the contact hole of the first interlayer insulating layer ILD1 and the contact hole of the gate insulating layer GI.

The first connection electrode CNE1 may be disposed on the second interlayer insulating layer ILD2. The first connection electrode CNE1 may electrically connect the source electrode SE/drain electrode DE of the thin film transistor TFT to the second connection electrode CNE2. The first connection electrode CNE1 may be inserted into a contact hole provided in the second interlayer insulating layer ILD2, the first interlayer insulating layer ILD1, and the gate insulating layer GI to be in contact with the source electrode SE/drain electrode DE of the thin film transistor TFT.

The first passivation layer PAS1 may cover the first connection electrode CNE1 and the second interlayer insulating layer ILD2. The first passivation layer PAS1 may protect the thin film transistor TFT. The first passivation layer PAS1 may include a contact hole through which the second connection electrode CNE2 passes.

The second connection electrode CNE2 may be disposed on the first passivation layer PAS1. The second connection electrode CNE2 may electrically connect the first connection electrode CNE1 to pixel electrodes AE1, AE2 and AE3 of the light emitting element ED. The second connection electrode CNE2 may be inserted into a contact hole formed in the first passivation layer PAS1 to be in contact with the first connection electrode CNE1.

The second passivation layer PAS2 may cover the second connection electrode CNE2 and the first passivation layer PAS1. The second passivation layer PAS2 may include a contact hole through which the pixel electrodes AE1 through AE3 of the light emitting element ED passes.

The light emitting element layer EML may be disposed on the thin film transistor layer TFTL. The light emitting element layer EML may include the light emitting element ED and a pixel defining layer BKL. The light emitting element ED may include the pixel electrodes AE1 through AE3, light emitting layers EL1, EL2 and EL3, and common electrodes CE1, CE2 and CE3.

The pixel electrodes AE1 through AE3 may be disposed on the second passivation layer PAS2. The pixel electrodes AE1 through AE3 may overlap any one of openings OP of the pixel defining layer BKL. The pixel electrodes AE1 through AE3 may be electrically connected to the drain electrode DE of the thin film transistor TFT through the first and second connection electrodes CNE1 and CNE2.

In an embodiment, the pixel electrodes AE1 through AE3 may include a first pixel electrode AE1, a second pixel electrode AE2 and a third pixel electrode AE3 disposed in each pixel PX. The first pixel electrode AE1, the second pixel electrode AE2 and the third pixel electrode AE3 may be spaced apart from each other on the second passivation layer PAS2. In some embodiments, each of the pixel electrodes AE1 through AE3 may constitute light emitting elements ED1 through ED3 emitting light of different colors.

The light emitting layers EL1 through EL3 may be disposed on the pixel electrodes AE1 through AE3, respectively.

In an embodiment, the light emitting layers EL1 through EL3 may be organic light emitting layers made of an organic material. In the light emitting layers EL1 through EL3, when the thin film transistor TFT applies a predetermined voltage to the pixel electrodes AE1 through AE3 of the light emitting elements ED1 through ED3, and the common electrodes CE1 through CE3 of the light emitting elements ED1 through ED3 receive a common voltage or a cathode voltage, holes and electrons may move to the light emitting layers EL1 through EL3 respectively through a hole transport layer and an electron transport layer, and the holes and electrons may be combined with each other in the light emitting layers EL1 through EL3 to emit light.

In another embodiment, the light emitting elements ED1 through ED3 may include a quantum dot light emitting diode including a quantum dot light emitting layer, an inorganic light emitting diode including an inorganic semiconductor, or a micro light emitting diode.

The light emitting layers EL1 through EL3 may include a first light emitting layer EL1, a second light emitting layer EL2, and a third light emitting layer EL3. The first light emitting layer EL1 may be disposed on the first pixel electrode AE1, the second light emitting layer EL2 may be disposed on the second pixel electrode AE2, and the third light emitting layer EL3 may be disposed on the third pixel electrode AE3. The first to third light emitting layers EL1 through EL3 may be the light emitting layers of the first to third light emitting elements ED1 through ED3, respectively. In some embodiments, the first light emitting layer EL1 may be the light emitting layer for emitting red light of the first color, the second light emitting layer EL2 may be the light emitting layer for emitting green light of the second color, and the third light emitting layer EL3 may be the light emitting layer for emitting blue light of the third color.

The common electrodes CE1 through CE3 may be disposed on the light emitting layers EL1 through EL3, respectively. The common electrodes CE1 through CE3 may include a transparent conductive material to transmit light generated in the light emitting layers EL1 through EL3. The common electrodes CE1 through CE3 may receive a common voltage or a low potential voltage. When the pixel electrodes AE1 through AE3 receive the voltage corresponding to a data voltage and the common electrodes CE1 through CE3 receive the low potential voltage, a potential difference is formed between the pixel electrodes AE1 through AE3 and the common electrodes CE1 through CE3, so that the light emitting layers EL1 through EL3 may emit light.

The common electrodes CE1 through CE3 may include a first common electrode CE1, a second common electrode CE2, and a third common electrode CE3. The first common electrode CE1 may be disposed on the first light emitting layer EL1, the second common electrode CE2 may be disposed on the second light emitting layer EL2, and the third common electrode CE3 may be disposed on the third light emitting layer EL3. However, as illustrated in FIG. 5, the common electrodes CE1 through CE3 may overlap the plurality of pixels PX as an integral electrode, and may be disposed over the entire surface of the display layer DU along the side surface and top surface of the pixel defining layer BKL and the top surfaces of the light emitting layers EL1 through EL3.

The pixel defining layer BKL may be disposed on the thin film transistor layer TFTL or the substrate SUB. The pixel defining layer BKL may include the opening OP disposed in each of the pixels PX. The opening OP of the pixel defining layer BKL may partition the emission area of each of the light emitting elements ED1 through ED3. For example, the light emitting elements ED1 through ED3 may overlap the openings OP of the pixel defining layer BKL, respectively.

In some embodiments, the opening OP of the pixel defining layer BKL may overlap the pixel electrodes AE1 through AE3 and expose portions of the lower pixel electrodes AE1 through AE3. For example, the pixel defining layer BKL may cover a portion of the pixel electrodes AE1 through AE3 at both ends of the pixel electrodes AE1 through AE3 and expose the remaining portion through the opening OP.

In some embodiments, the light emitting layers EL1 through EL3 of the light emitting elements ED1 through ED3 may be disposed in the opening OP of the pixel defining layer BKL. However, the present disclosure is not limited thereto, and the light emitting layers EL1 through EL3 may be conformally disposed on the pixel defining layer BKL along the side surface and the top surface of the pixel defining layer BKL.

In some embodiments, the common electrodes CE1 through CE3 may be conformally disposed on the pixel defining layer BKL along the side surface and the top surface of pixel defining layer BKL. However, the present disclosure is not limited thereto, and the common electrodes CE1 through CE3 may be disposed in the opening OP of the pixel defining layer BKL.

The thin film encapsulation layer TFEL may be disposed on the light emitting elements ED1 through ED3 and the pixel defining layer BKL, and may cover the plurality of light emitting elements ED1 through ED3 and the pixel defining layer BKL. A portion of the thin film encapsulation layer TFEL may be disposed in the openings OP of the pixel defining layer BKL. The thin film encapsulation layer TFEL may include at least one inorganic layer to prevent oxygen or moisture from permeating into the light emitting element layer EML. The thin film encapsulation layer TFEL may include at least one organic layer to protect the light emitting element layer EML from foreign substances such as dust.

In an embodiment, the thin film encapsulation layer TFEL may include a first encapsulation layer TFE1, a second encapsulation layer TFE2, and a third encapsulation layer TFE3 that are sequentially stacked. The first encapsulation layer TFE1 and the third encapsulation layer TFE3 may be inorganic encapsulation layers, and the second encapsulation layer TFE2 disposed between the first encapsulation layer TFE1 and the third encapsulation layer TFE3 may be an organic encapsulation layer.

Each of the first encapsulation layer TFE1 and the third encapsulation layer TFE3 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride.

The second encapsulation layer TFE2 may include a polymer-based material. Examples of the polymer-based material may include acrylic resin, epoxy resin, polyimide, polyethylene and the like. For example, the second encapsulation layer TFE2 may include an acrylic resin, for example, polymethyl methacrylate, polyacrylic acid, or the like. The second encapsulation layer TFE2 may be formed by curing a monomer or applying a polymer.

In an embodiment, the first encapsulation layer TFE1 may be disposed on the common electrodes CE1 through CE3. The first encapsulation layer TFE1 may be conformally disposed along the shape of the common electrodes CE1 through CE3. The second encapsulation layer TFE2 may be disposed on the first encapsulation layer TFE1. The second encapsulation layer TFE2 may serve to planarize the stepped portion of the lower layer (e.g., the first encapsulation layer TFE1). The third encapsulation layer TFE3 may be disposed on the second encapsulation layer TFE2.

The touch sensing layer TSU may be disposed on the thin film encapsulation layer TFEL. The touch sensing layer TSU may include a first touch insulating layer SIL1, a second touch insulating layer SIL2, a touch electrode TEL, and a third touch insulating layer SIL3.

The first touch insulating layer SIL1 may be disposed on the thin film encapsulation layer TFEL. For example, the first touch insulating layer SIL1 may be in direct contact with the third encapsulation layer TFE3. The first touch insulating layer SIL1 may have an insulating and optical function. The first touch insulating layer SIL1 may include at least one inorganic layer. Optionally, the first touch insulating layer SIL1 may be omitted.

The second touch insulating layer SIL2 may cover the first touch insulating layer SIL1. A touch electrode of another layer may be further disposed on the first touch insulating layer SIL1, and the second touch insulating layer SIL2 may cover the touch electrode. The second touch insulating layer SIL2 may have an insulating and optical function. For example, the second touch insulating layer SIL2 may be an inorganic layer containing at least one of a silicon nitride layer, a silicon oxynitride layer, a silicon oxide layer, a titanium oxide layer, or an aluminum oxide layer.

The touch electrode TEL may be disposed on the second touch insulating layer SIL2. The touch electrode TEL may not overlap the light emitting elements ED1 through ED3. The touch electrode TEL may overlap the pixel defining layer BKL. The touch electrode TEL may be formed of a single layer containing molybdenum (Mo), titanium (Ti), copper (Cu), aluminum (Al), or indium tin oxide (ITO), or may be formed to have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO.

The third touch insulating layer SIL3 may cover the touch electrode TEL and the second touch insulating layer SIL2. The third touch insulating layer SIL3 may have an insulating and optical function. The third touch insulating layer SIL3 may be made of the material in association with the second touch insulating layer SIL2.

The color filter layer CFL may include a light blocking layer BM and the color filters CF1, CF2, and CF3.

The light blocking layer BM may be disposed on the touch sensing layer TSU. The light blocking layer BM may include a plurality of opening holes OPT1, OPT2, and OPT3 overlapping the opening OP of the pixel defining layer BKL and the light emitting layers EL1 through EL3. For example, the first opening hole OPT1 may overlap the first light emitting layer EL1. The second opening hole OPT2 may overlap the second light emitting layer EL2, and the third opening hole OPT3 may overlap the third light emitting layer EL3. The area or size of each of the opening holes OPT1, OPT2, and OPT3 may be greater than the area or size of each of the openings OP of the pixel defining layer BKL. The opening holes OPT1, OPT2, and OPT3 of the light blocking layer BM are formed to be larger than the respective openings OP of the pixel defining layer BKL, so that the light emitted from the light emitting layers EL1 through EL3 may be visually recognized by the user not only from the front surface of the display device 10 but also from the side surface of the display device 10.

The light blocking layer BM may include a light absorbing material. For example, the light blocking layer BM may include an inorganic black pigment or an organic black pigment. The inorganic black pigment may be carbon black, and the organic black pigment may include at least one of lactam black, perylene black, or aniline black, but they are not limited thereto. The light blocking layer BM may prevent visible light infiltration and color from mixing between the adjacent pixels PX, which leads to the improvement of color reproducibility of the display device 10.

The color filters CF1, CF2, and CF3 may be disposed on the light blocking layer BM. The color filters CF1, CF2, and CF3 may overlap the opening holes OPT1, OPT2, and OPT3 of the light blocking layer BM, respectively. The color filters CF1, CF2, and CF3 may have areas greater than those of the opening holes OPT1, OPT2, and OPT3 of the light blocking layer BM, respectively, and the color filters CF1, CF2, and CF3 may completely cover the light exit area formed by the opening holes OPT1, OPT2, and OPT3 of the light blocking layer BM, respectively.

The color filters CF1, CF2, and CF3 may include a first color filter CF1, a second color filter CF2, and a third color filter CF3. The color filters CF1, CF2, and CF3 may include a colorant such as a dye or a pigment that absorbs light in a wavelength band other than light in a specific wavelength band, and may be disposed to correspond to the color of the light emitted from the light emitting layers EL1 through EL3. For example, the first color filter CF1 may be a red color filter that overlaps the first light emitting layer EL1 and transmits only the first light of the red color. The second color filter CF2 may be a green color filter that overlaps the second light emitting layer EL2 and transmits only the second light of the green color, and the third color filter CF3 may be a blue color filter that overlaps the third light emitting layer EL3 and transmits only the third light of the blue color.

Since the color filters CF1 through CF3 overlap each other in the display device 10, the intensity of reflected light due to external light can be reduced. Further, the color of reflected light due to external light can be controlled by adjusting the arrangement, shapes, and areas of the color filters CF1 through CF3 in a plan view.

The color filter layer CFL may further include an overcoat layer OC. The overcoat layer OC may be disposed on the color filters CF1, CF2, and CF3 to planarize the top ends of the color filters CF1, CF2, and CF3. The overcoat layer OC may be a colorless light transmissive layer that does not have a color in a visible light band. For example, the overcoat layer OC may include a colorless light transmissive organic material such as an acrylic resin.

Figure 6:
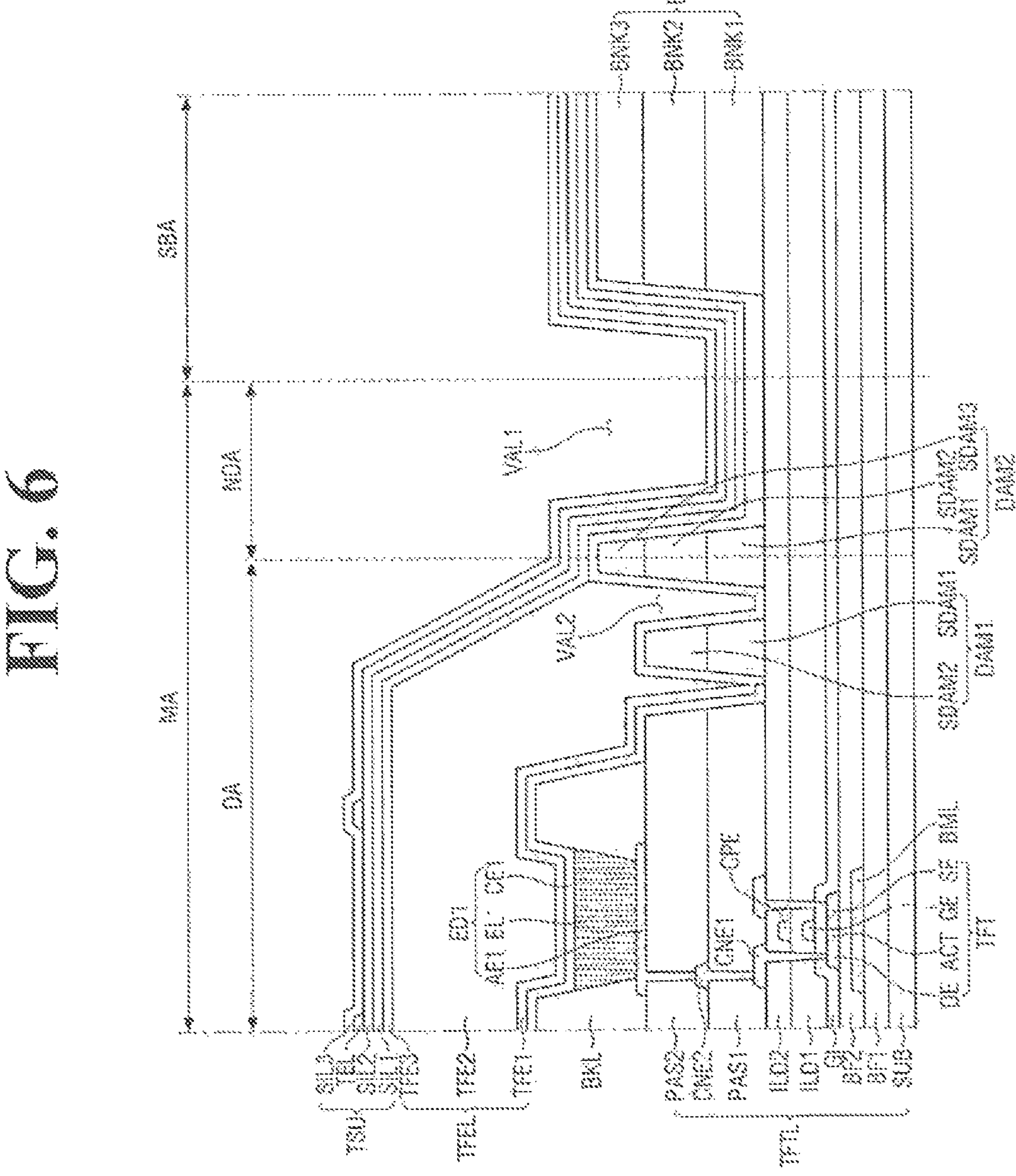
FIG. 6 is a cross-sectional view of a portion of a main area and a sub-region of a display device according to an embodiment.

FIG. 6 is a cross-sectional view of a portion of main area and sub-region of a display device according to an embodiment.

Referring to FIG. 6, the display device 10 may include a first dam DAM1 and a second dam DAM2 disposed in the display area DA or the non-display area NDA and a bank structure BNK disposed in the sub-region SBA.

The first dam DAM1 and the second dam DAM2 may be disposed at the outermost portion of the display area DA or the non-display area NDA. The first dam DAM1 and the second dam DAM2 may surround at least a portion of the display area DA. The first dam DAM1 and the second dam DAM2 may prevent the second encapsulation layer TFE2 of the thin film encapsulation layer TFEL from overflowing to the non-display area NDA.

The display device 10 is illustrated to include two dams in FIG. 6, but the present disclosure is not limited thereto. The display device 10 may include one dam, or more than three dams.

The first dam DAM1 may include a first sub-dam SDAM1 and a second sub-dam SDAM2, and the second dam DAM2 may include a first sub-dam SDAM1, a second sub-dam SDAM2, and a third sub-dam SDAM3. The first sub-dam SDAM1 and the first passivation layer PAS1 may include the same material, and may be disposed on the same layer. The second sub-dam SDAM2 and the second passivation layer PAS2 may include the same material, and may be disposed on the same layer. The third sub-dam SDAM3 may be disposed on the second sub-dam SDAM2, and may include the same material as that of the second sub-dam SDAM2.

The height of the first dam DAM1 may be lower than the height of the second dam DAM2. For example, the second dam DAM2 may be taller than the first DAM1 by the third sub-dam SDAM3. However, the present disclosure is not limited thereto. The height of the first dam DAM1 may be substantially the same as the height of the second dam DAM2 or may be higher than the height of the second dam DAM2.

The bank structure BNK may be disposed in the sub-region SBA. However, the present disclosure is not limited thereto, and the bank structure BNK may be disposed to extend from the non-display area NDA to the sub-region SBA. The bank structure BNK may protect various lines disposed below the bank structure BNK and extending from the display area DA to the sub-region SBA. In addition, the bank structure BNK may provide a support space in which a mask for patterning can be placed in the lamination process of the display panel 100.

The bank structure BNK may include a first bank layer BNK1, a second bank layer BNK2 and a third bank layer BNK3. The first bank layer BNK1 and the first passivation layer PAS1 may include the same material, and may be disposed on the same layer. The second bank layer BNK2 and the second passivation layer PAS2 may include the same material, and may be disposed on the same layer. The third bank layer BNK3 and the second bank layer BNK2 may include the same material and third bank layer BNK3 may be disposed on the second bank layer BNK2. In another embodiment, the third bank layer BNK3 may include the same material as the pixel defining layer BKL.

The height of the bank structure BNK may be the same as the height of the second dam DAM2, but is not limited thereto. The height of the bank structure BNK may be greater or less than the height of the second dam DAM2.

A first valley VAL1 may be disposed between the second dam DAM2 and the bank structure BNK. The first valley VAL1 may be formed between the second dam DAM2 and the bank structure BNK when an organic film layer such as the first and second passivation layers PAS1 and PAS2 is not included in this area. For example, the first valley VAL1 may be formed by a height stepped portion due to the second dam DAM2 and the bank structure BNK.

A second valley VAL2 may be disposed between the first dam DAM1 and the second dam DAM2. The second valley VAL2 may be formed between the first dam DAM1 and the second dam DAM2 when organic film layer such as the first and second passivation layers PAS1 and PAS2 is not included in this area. For example, the second valley VAL2 may be formed by a height stepped portion between the first dam DAM1 and the second dam DAM2.

In an embodiment, the first and third encapsulation layers TFE1 and TFE3 may cover the first dam DAM1, the second dam DAM2 and the bank structure BNK. For example, the first encapsulation layer TFE1 and the third encapsulation layer TFE3 may extend beyond the first dam DAM1, the second valley VAL2, the second dam DAM2, the first valley VAL1, and the bank structure BNK to the outermost edge of the display panel 100. For example, the first encapsulation layer TFE1 may contact each of the first dam DAM1, the second dam DAM2, the bottom of the first valley VAL1, bottom of the second valley VAL2 and the bank structure BNK.

In another embodiment, at least one of the first encapsulation layer TFE1 and the third encapsulation layer TFE3 may extend only to the upper surface of the second dam DAM2. For example, at least one of the first encapsulation layer TFE1 and the third encapsulation layer TFE3 may be disposed on the first dam DAM1, the second valley VAL2, and the second dam DAM2, but not disposed on the first valley VAL1 and the bank structure BNK.

The second encapsulation layer TFE2 may not overflow to the edge of the display panel 100 due to the first dam DAM1 and the second dam DAM2. The second encapsulation layer TFE2 may not be disposed outside the second dam DAM2. In other words, the second encapsulation layer TFE2 may not be provided on the side of the second dam DAM2 where the first valley VAL1 is located. For example, the second encapsulation layer TFE2 may be disposed to cover the upper surface of the first dam DAM1 but not cover the upper surface of the second dam DAM2. As another example, the second encapsulation layer TFE2 may partially cover the upper surface of the second dam DAM2, but may not be disposed outside the second dam DAM2. Accordingly, the second encapsulation layer TFE2 may be disposed within the second valley VAL2, but may not be disposed within the first valley VAL1.

In an embodiment, the gate insulating layer GI, the first interlayer insulating layer ILD1, the second interlayer insulating layer ILD2, the first passivation layer PAS1, and the second passivation layer PAS2 among the thin film transistor layer TFTL may be removed from a portion of the non-display area NDA and a portion of the sub-region SBA located outside the second dam DAM2. For example, only the buffer layers BF1 and BF2 of the thin film transistor layer TFTL may be disposed outside the second dam DAM2. Accordingly, the bank structure BNK may be directly disposed on the second buffer layer BF2. In addition, when at least one of the first encapsulation layer TFE1 and the third encapsulation layer TFE3 extends to the outermost edge of the display panel 100, at least one of the first encapsulation layer TFE1 and the third encapsulation layer TFE3 may be directly disposed on the second buffer layer BF2 in the first valley VAL1.

However, the present disclosure is not limited thereto, and as illustrated in FIG. 6, the gate insulating layer GI, the first interlayer insulating layer ILD1, and the second interlayer insulating layer ILD2 among the thin film transistor layer TFTL may extend to the outermost edge of the display panel 100 across the non-display area NDA and the sub-region SBA. For example, the gate insulating layer GI, the first interlayer insulating layer ILD1, and the second interlayer insulating layer ILD2 may be disposed under the bank structure BNK. Accordingly, the bank structure BNK may be directly disposed on the second interlayer insulating layer ILD2. For example, the first bank layer BNK1 of the bank structure BNK may be in direct contact with the second interlayer insulating layer ILD2. In addition, when at least one of the first encapsulation layer TFE1 and the third encapsulation layer TFE3 extends to the outermost edge of the display panel 100, at least one of the first encapsulation layer TFE1 and the third encapsulation layer TFE3 may be directly disposed on the second interlayer insulating layer ILD2 in the first valley VAL1. For example, the first encapsulation layer TFE1 may be in direct contact with the second interlayer insulating layer ILD2 in the first valley VAL1.

In an embodiment, the first touch insulating layer SIL1, the second touch insulating layer SIL2 and the third touch insulating layer SIL3 may overlap the first dam DAM1, the second dam DAM2 and the bank structure BNK. For example, the first touch insulating layer SIL1, the second touch insulating layer SIL2 and the third touch insulating layer SIL3 may extend beyond the first dam DAM1, the second valley VAL2, the second dam DAM2, the first valley VAL1, and the bank structure BNK to the outermost edge of the display panel 100.

In another embodiment, at least one of the first touch insulating layer SIL1, the second touch insulating layer SIL2 and the third touch insulating layer SIL3 may extend only to the upper surface of the second dam DAM2. For example, at least one of the first touch insulating layer SIL1, the second touch insulating layer SIL2 and the third touch insulating layer SIL3 may be disposed on the first dam DAM1, the second valley VAL2, and the second dam DAM2, but not disposed on the first valley VAL1 and the bank structure BNK.

Hereinafter, a display device according to another embodiment of the present disclosure will be described. In the following description, the same or similar elements will be denoted by the same or similar reference numerals, and redundant descriptions will be omitted or briefly described.

Figure 7:
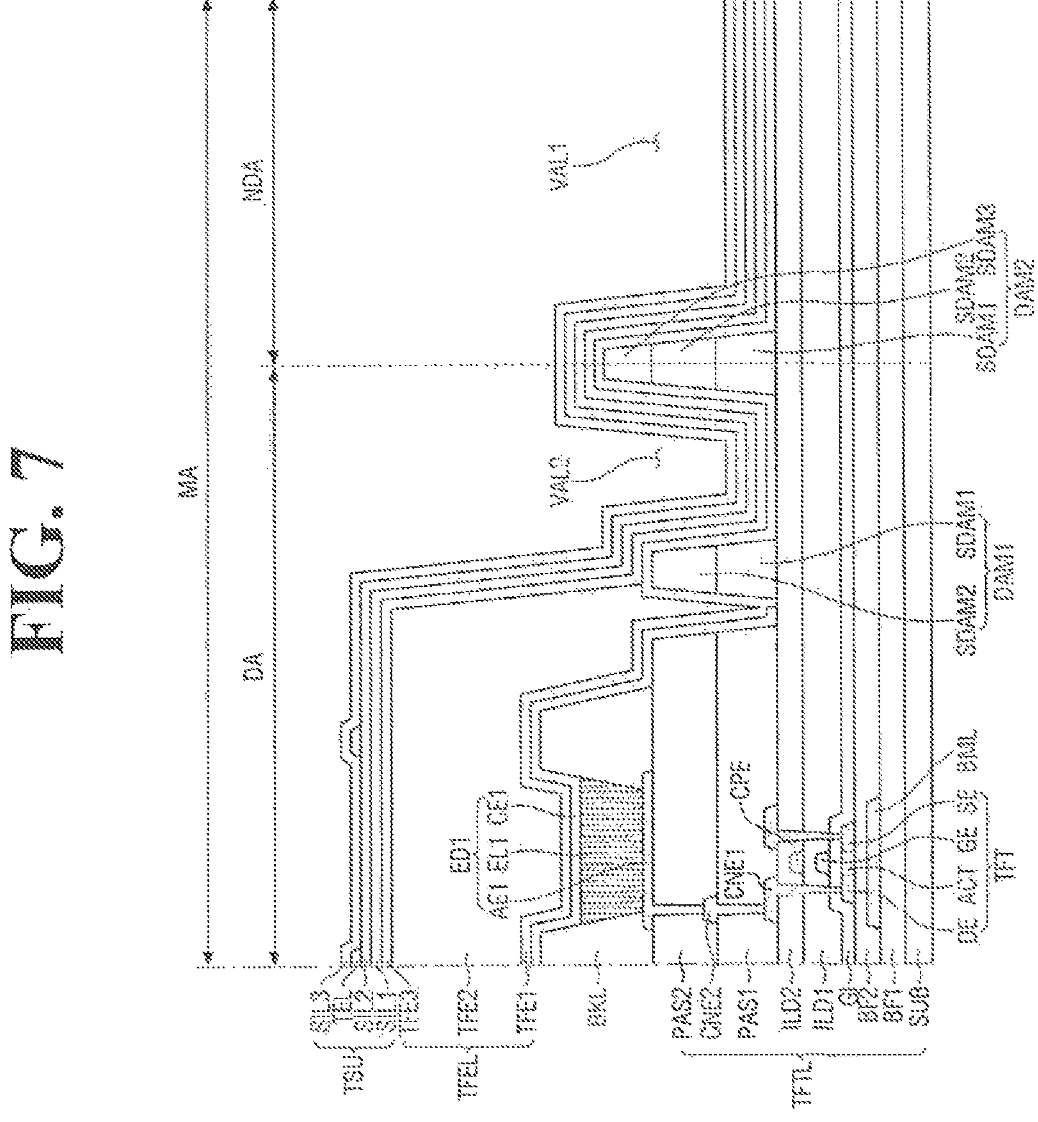
FIG. 7 is a cross-sectional view illustrating a portion of a main area of a display device according to another embodiment.

FIG. 7 is a cross-sectional view illustrating a portion of a main area of a display device according to another embodiment. In FIG. 7, sub-regions are not shown for convenience of description.

Referring to FIG. 7, the display device 10 according to the present embodiment is different from the display device 10 according to an embodiment described with reference to FIG. 6 and the like in that the second encapsulation layer TFE2 is not disposed outside the first dam DAM1.

More specifically, the second encapsulation layer TFE2 may not be disposed outside the first dam DAM1. For example, the second encapsulation layer TFE2 may not extend beyond the first dam DAM1. For example, the second encapsulation layer TFE2 may not cover either of the upper surfaces of the first dam DAM1 and the second dam DAM2. As another example, the second encapsulation layer TFE2 may partially cover the upper surface of the first dam DAM1, but may not be disposed outside the first dam DAM1. Accordingly, the second encapsulation layer TFE2 may not be disposed in the second valley VAL2.

In an embodiment, the first encapsulation layer TFE1 and the third encapsulation layer TFE3 may cover the first dam DAM1 and the second dam DAM2. For example, the first encapsulation layer TFE1 and the third encapsulation layer TFE3 may extend beyond the first dam DAM1, the second valley VAL2, the second dam DAM2 and the first valley VAL1 to the outermost edge of the display panel 100.

In another embodiment, at least one of the first encapsulation layer TFE1 and the third encapsulation layer TFE3 may extend only to the upper surface of the first dam DAM1. For example, at least one of the first encapsulation layer TFE1 and the third encapsulation layer TFE3 may be disposed on the first dam DAM1, but not disposed on the second valley VAL2, the second dam DAM2, and the first valley VAL1.

In an embodiment, the first touch insulating layer SIL1, the second touch insulating layer SIL2 and the third touch insulating layer SIL3 may cover the first dam DAM1 and the second dam DAM2. For example, the first touch insulating layer SIL1, the second touch insulating layer SIL2 and the third touch insulating layer SIL3 may extend beyond the first dam DAM1, the second valley VAL2, the second dam DAM2 and the first valley VAL1 to the outermost edge of the display panel 100.

In another embodiment, at least one of the first touch insulating layer SIL1, the second touch insulating layer SIL2 and the third touch insulating layer SIL3 may extend only to the upper surface of the first dam DAM1. For example, at least one of the first touch insulating layer SIL1, the second touch insulating layer SIL2 and the third touch insulating layer SIL3 may be disposed on the first dam DAM1, but not disposed on the second valley VAL2, the second dam DAM2, and the first valley VAL1.

Figure 8:
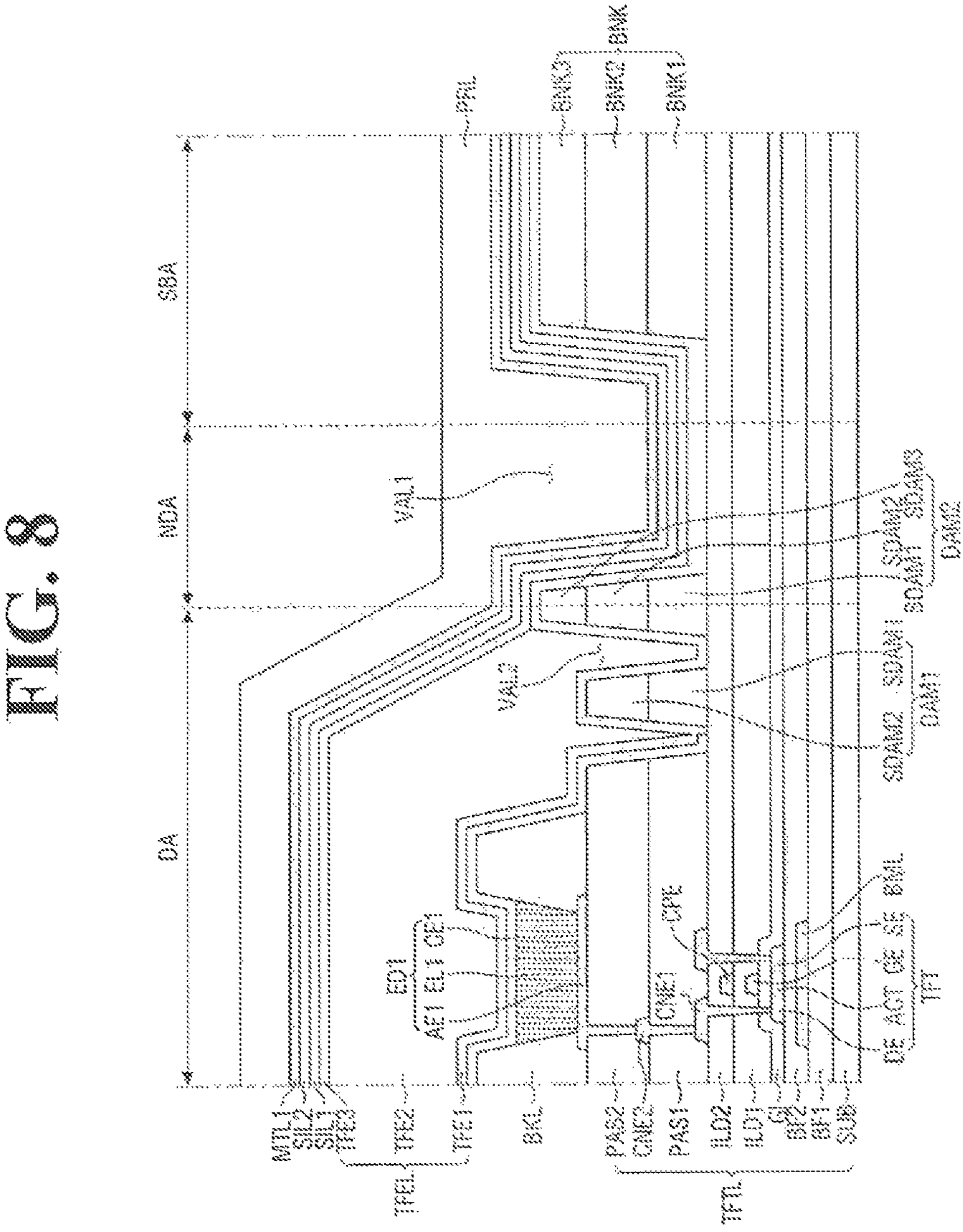
Figure 9:
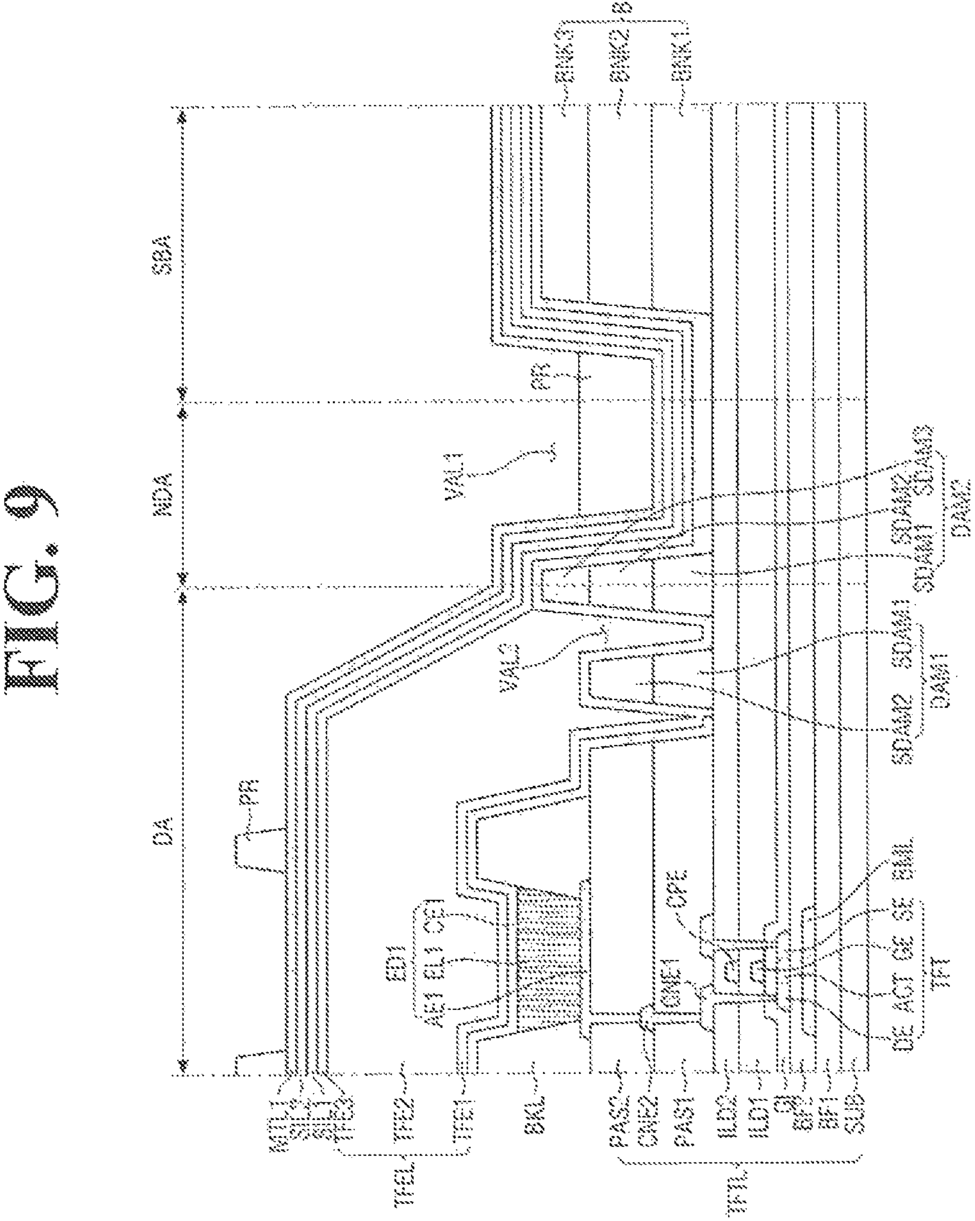
Figure 10:
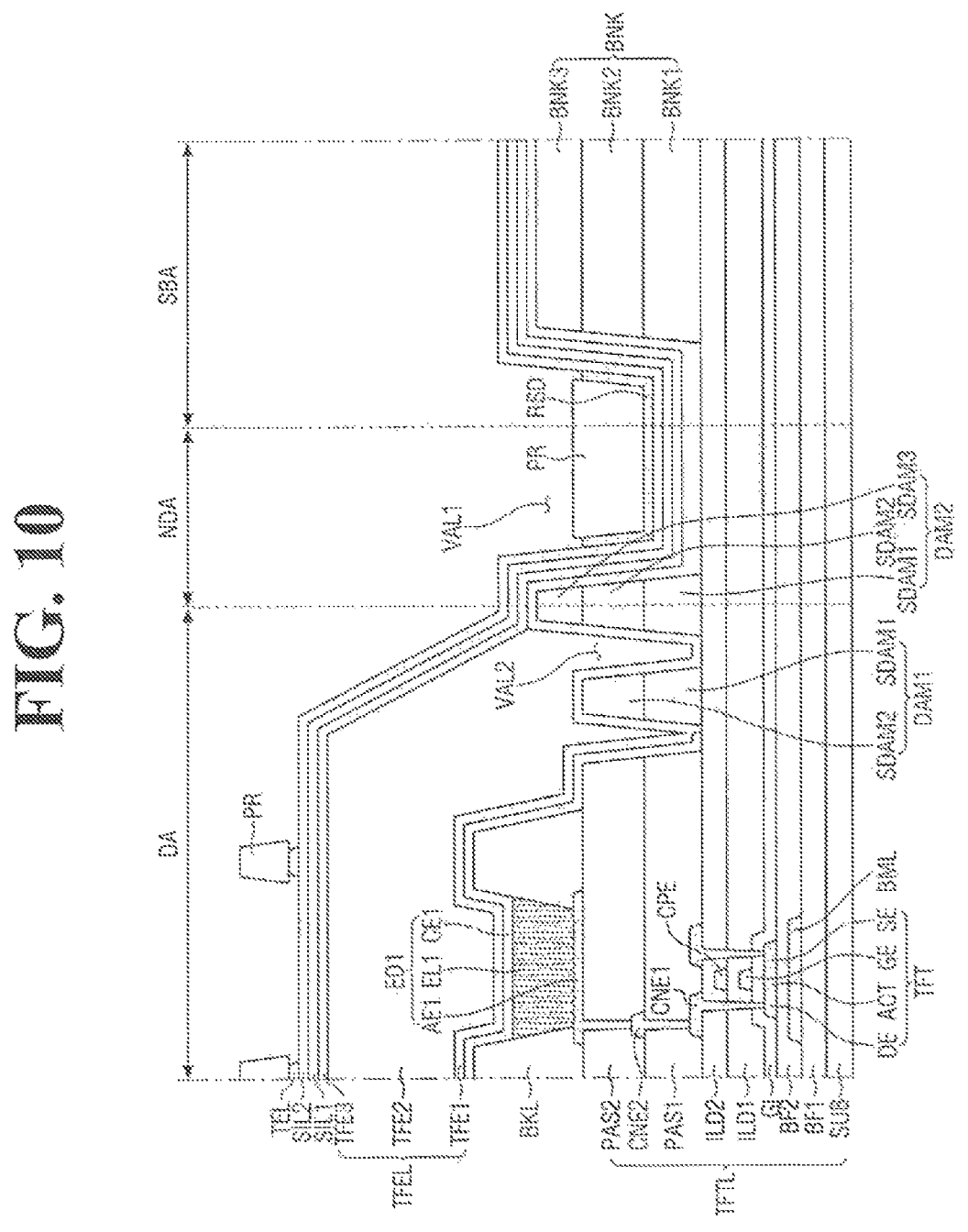

FIGS. 8 to 10 are cross-sectional views illustrating some steps of a method for manufacturing a display device according to a conventional example.

Referring to FIGS. 8 to 10, in the display device 10 according to the embodiments described above with reference to FIGS. 1 to 7, touch electrodes TEL may not be disposed in the first valley VAL1 and the second valley VAL2.

The touch electrodes TEL may be formed through a photolithography process. The photolithography process may be performed by etching the first metal layer MTL1 using a photoresist pattern PR as a mask.

For example, as illustrated in FIG. 8, a photoresist layer PRL may be formed on the first metal layer MTL1. For example, the photoresist layer PRL may be filled in the first valley VAL1. As another example, when the second encapsulation layer TFE2 is not disposed in the second valley VAL2, the photoresist layer PRL may be filled in the second valley VAL2.

Next, as illustrated in FIG. 9, a photoresist pattern PR may be formed by removing a portion of the photoresist layer PRL through exposure and development. At this time, the first valley VAL1 and the second valley VAL2 may include a deep valley due to a height stepped portion according to the first dam DAM1, the second dam DAM2, and the bank structure BNK. Accordingly, when the photoresist layer PRL is disposed within at least of the first valley VAL1 and the second valley VAL2, the photoresist layer PRL may not be properly removed. For example, a residue of the photoresist layer PRL may remain in at least of the first valley VAL1 and the second valley VAL2.

Next, as illustrated in FIG. 10, a touch electrode TEL may be formed by etching the first metal layer MTL1 using the remaining photoresist pattern PR as a mask. At this time, due to the residue of the photoresist pattern PR remaining in at least of the first valley VAL1 and the second valley VAL2, a residue RSD of the first metal layer MTL1 may remain in at least of the first valley VAL1 and the second valley VAL2. For example, the residue RSD of the first metal layer MTL1 may be provided along the bottom and sides of the first valley VAL1.

Hereinafter, a method for manufacturing a display device according to an embodiment capable of preventing such residue will be described.

Figure 11:
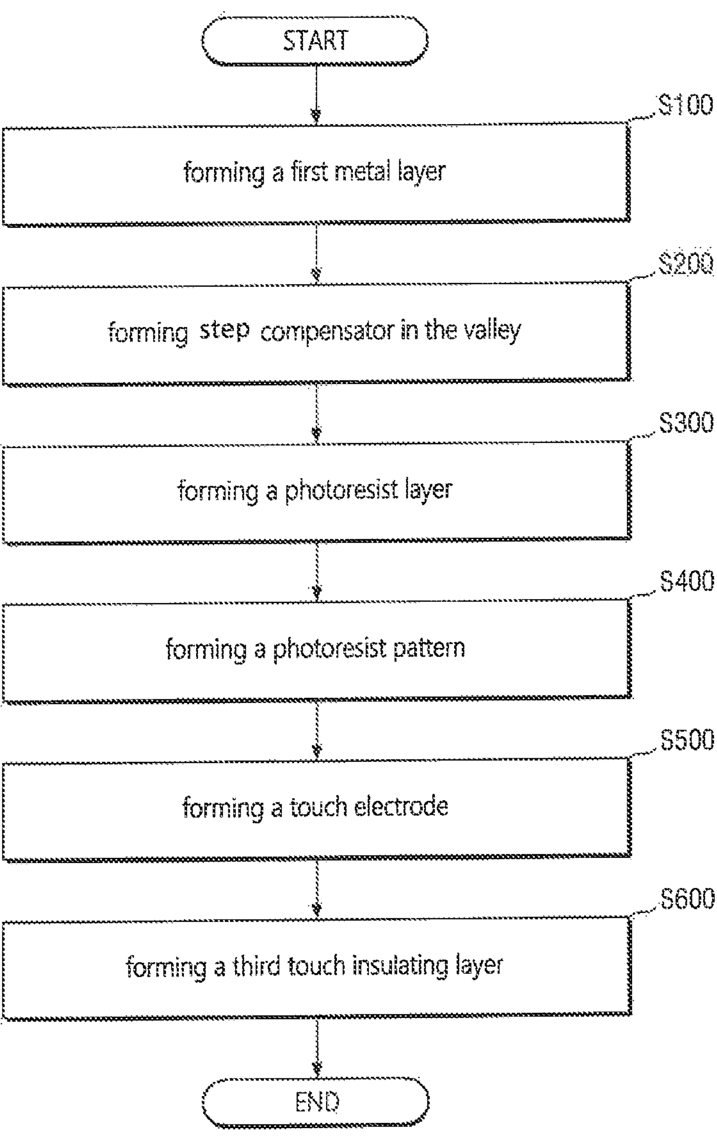
FIG. 11 is a flowchart illustrating a method for manufacturing a display device according to an embodiment.
Figure 12:
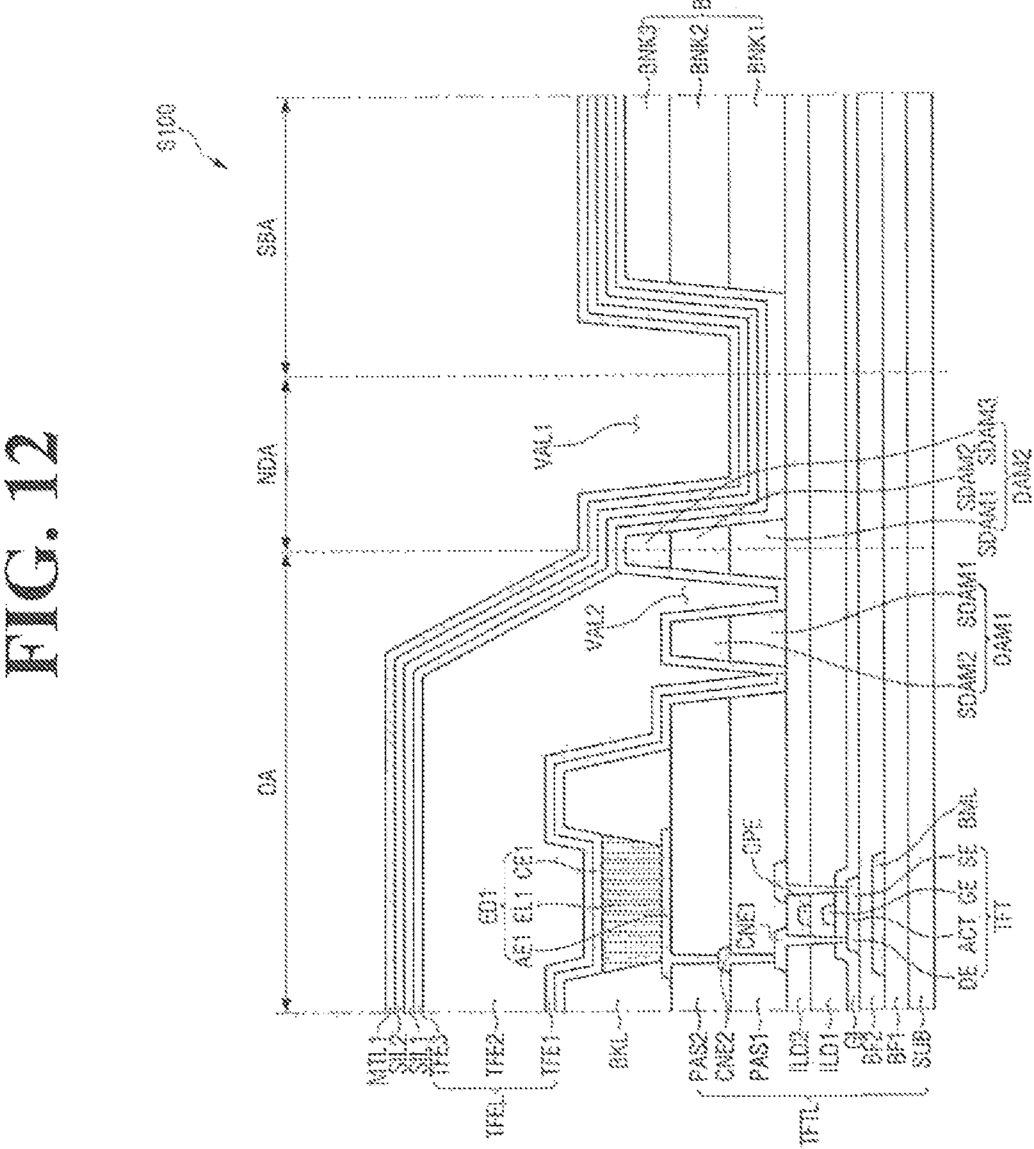
FIG. 12 is a cross-sectional view showing step S100 of FIG. 11.
Figure 13:
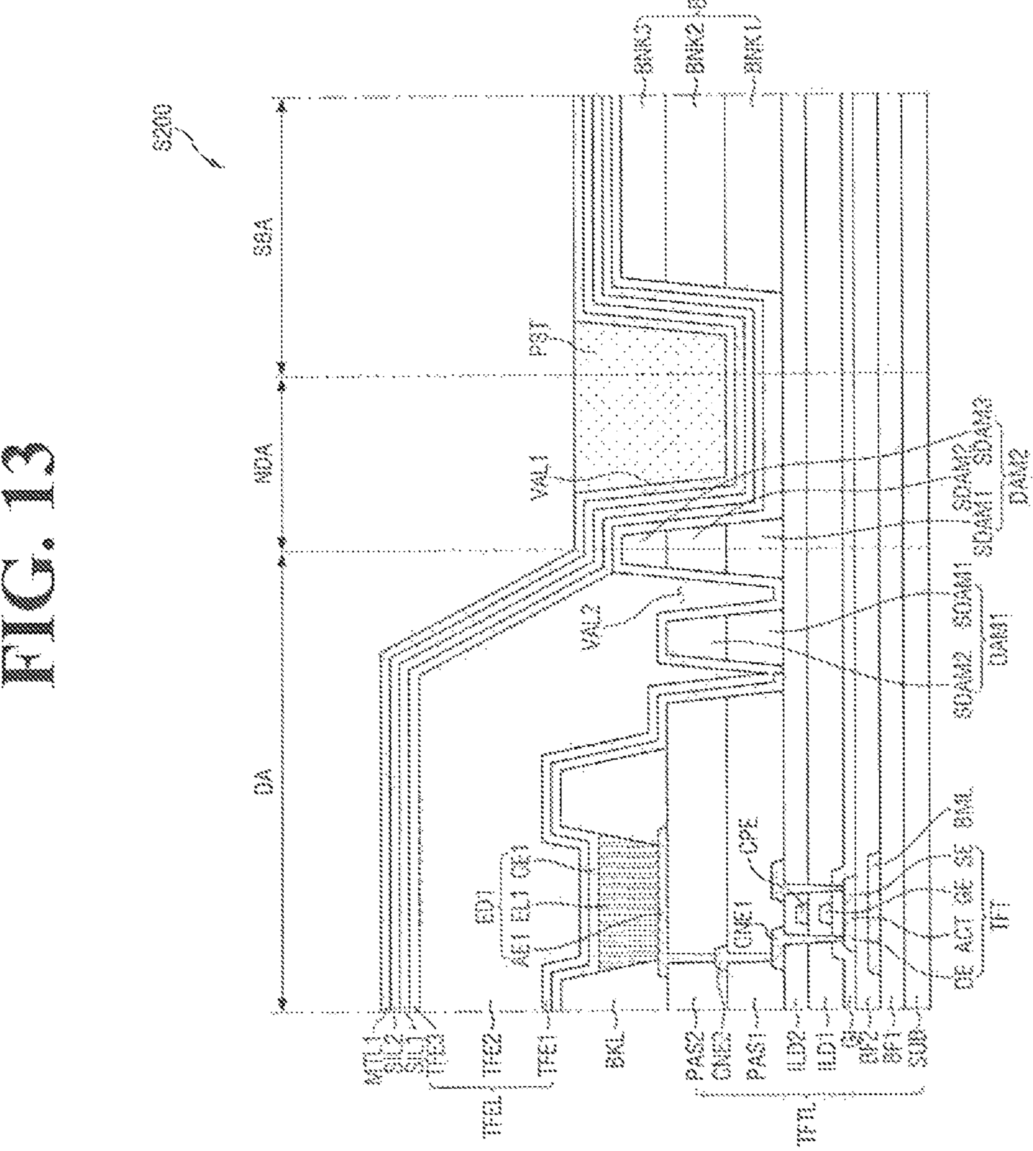
FIG. 13 is a cross-sectional view showing step S200 of FIG. 11.
Figure 15:
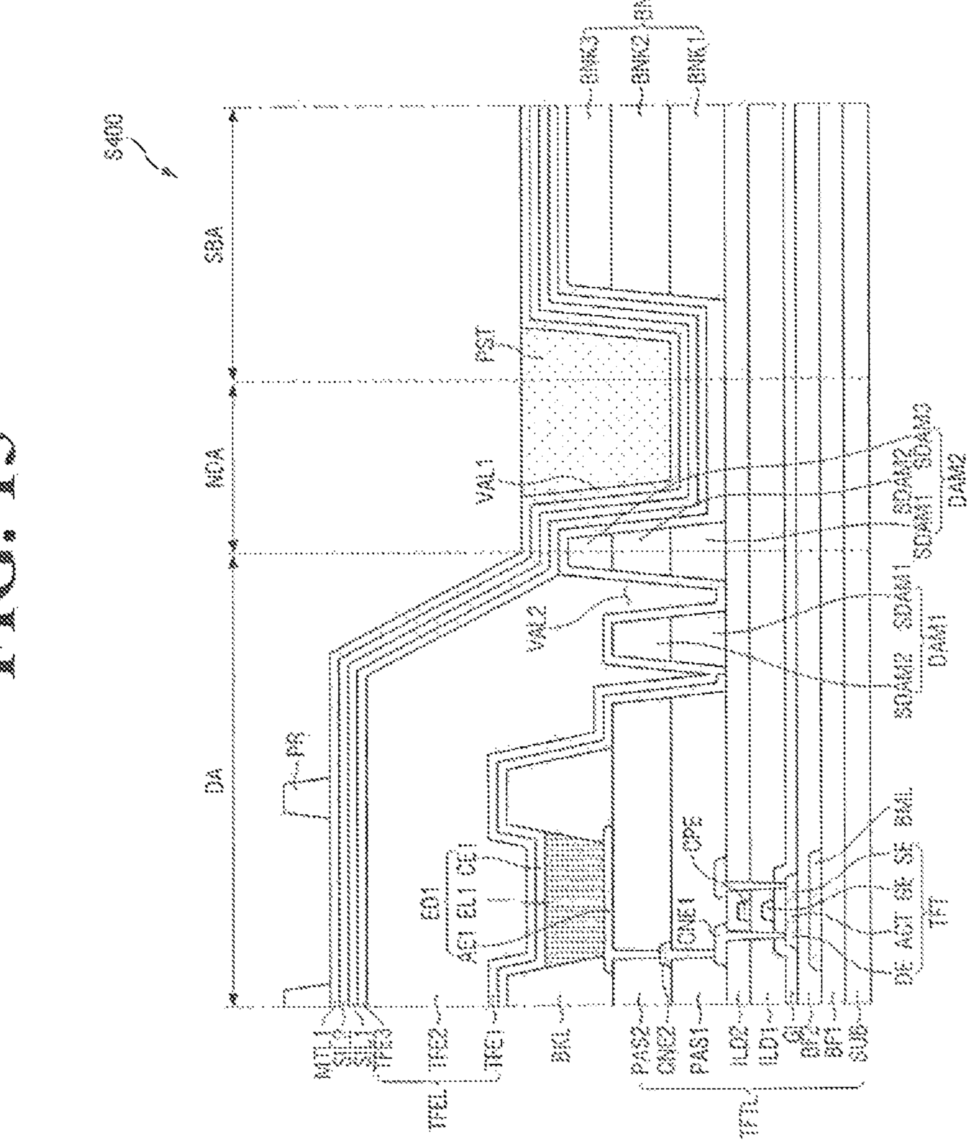
FIG. 15 is a cross-sectional view showing step S400 of FIG. 11.
Figure 16:
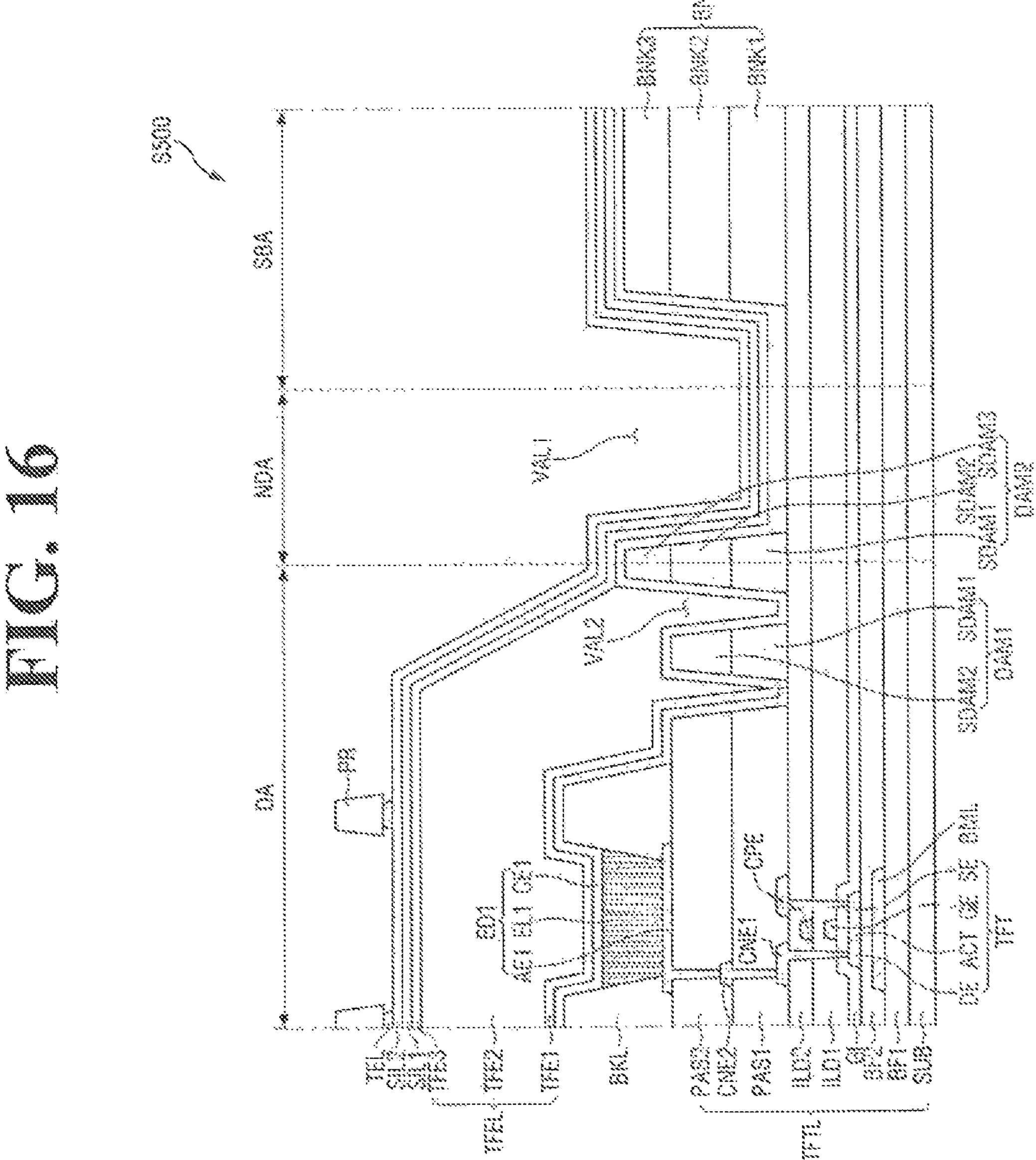
FIG. 16 is a cross-sectional view showing step S500 of FIG. 11.
Figure 17:
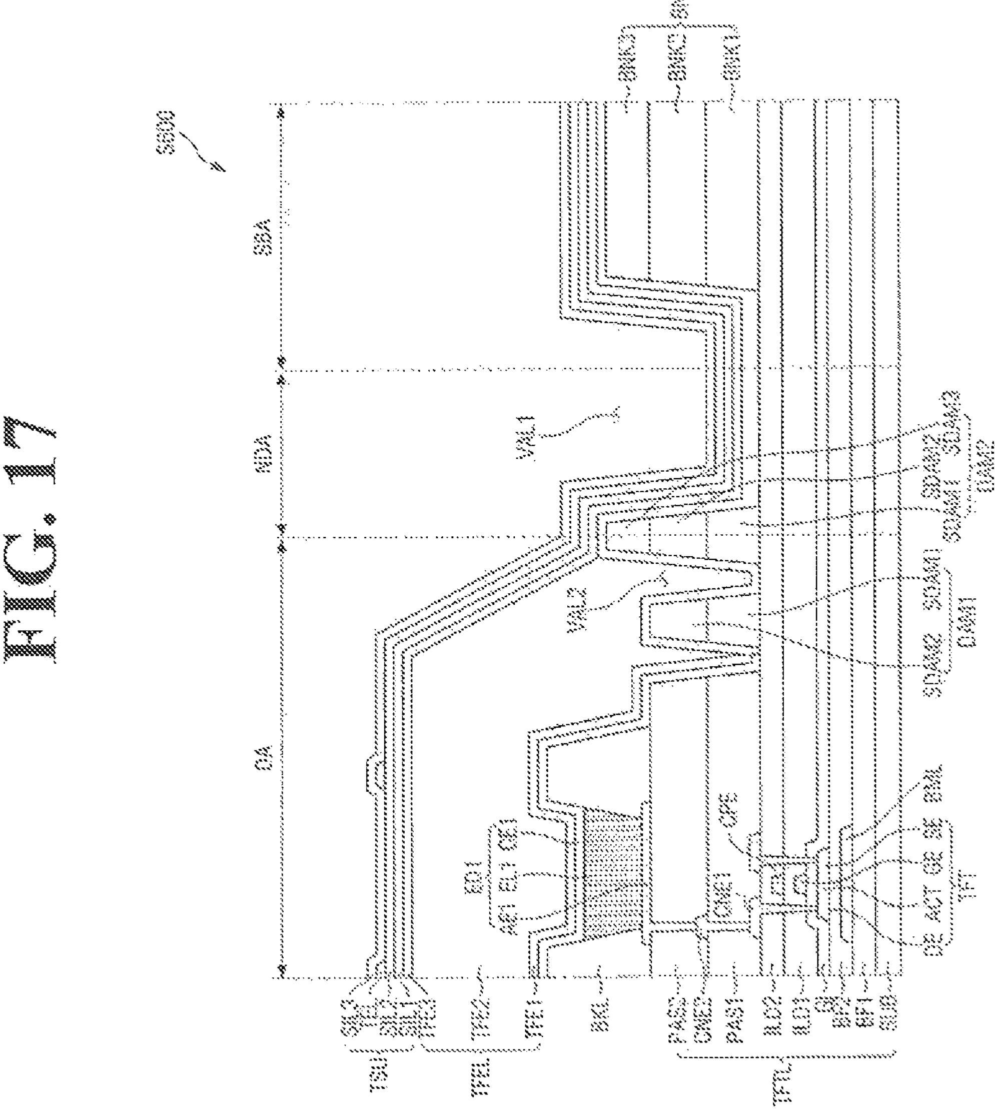
FIG. 17 is a cross-sectional view showing step S600 of FIG. 11.

FIG. 11 is a flowchart illustrating a method for manufacturing a display device according to an embodiment. FIG. 12 is a cross-sectional view showing step S100 of FIG. 11. FIG. 13 is a cross-sectional view showing step S200 of FIG. 11. FIG. 14 is a cross-sectional view showing step S300 of FIG. 11. FIG. 15 is a cross-sectional view showing step S400 of FIG. 11. FIG. 16 is a cross-sectional view showing step S500 of FIG. 11. FIG. 17 is a cross-sectional view showing step S600 of FIG. 11.

Referring to FIGS. 11 to 17, a method S1 for manufacturing a display device according to an embodiment includes forming a first metal layer (S100), forming a step compensator in the valley (S200), forming a photoresist layer (S300), forming a photoresist pattern (S400), forming a touch electrode (S500), and forming a third touch insulating layer (S600).

First, as illustrated in FIG. 12, a first metal layer MTL1 may be formed on the second touch insulating layer SIL2. (S100 of FIG. 11)

The first metal layer MTL1 may include a first metal. The first metal may include molybdenum (Mo), titanium (Ti), copper (Cu), aluminum (Al), and indium tin oxide (ITO), or a laminated structure of aluminum and titanium (Ti/Al/Ti), a laminated structure of aluminum and ITO (ITO/Al/ITO), an APC alloy, and a laminated structure of APC alloy and ITO (ITO/APC/ITO).

Second, as illustrated in FIG. 13, a step compensator PST may be formed on the first metal layer MTL1 in the first valley VAL1. (S200 of FIG. 11)

The step compensator PST may include the same material as the first metal layer MTL1. For example, the step compensator PST may include the first metal mentioned above. The step compensator PST may fill the first valley VAL1.

In some embodiments, the step compensator PST may be disposed within the first valley VAL1 using a screen printing method. For example, the step compensator PST may be formed by applying paste into the first valley VAL1 through a fine slit of a fine metal mask.

The paste may include a solvent capable of dissolving the first metal in addition to the first metal. The solvent may be composed of a volatile solvent and volatilized after application, so that only the first metal remains in the step compensator PST. For example, the solvent may include at least one of an alcohol-based solvent, an ester-based solvent, a ketone-based solvent, and a glycol-based solvent. Specifically, the solvent may include an alcohol-based solvent such as isobutanol, butanol, or 2-(2-ethoxyethoxy) ethanol. The solvent may include an ester-based solvent such as butyl acetate or isobutyl acetate. The solvent may include a ketone-based solvent such as methyl isobutyl ketone. The solvent may include a glycol-based solvent such as Propylene Glycol Methyl Ether (PGME) or Ethylene Glycol Monopropyl Ether (EGPE).

The upper surface of the step compensator PST may be positioned at the same height as the upper surface of the first metal layer MTL1. For example, the upper surface of the step compensator PST may be coplanar with the upper surface of the first metal layer MTL1 in the first valley VAL1. For example, the top surface of the first metal layer MTL1 may be flattened by filling the first valley VAL1 with the step compensator PST.

Thirdly, as illustrated in FIG. 14, a photoresist layer PRL may be formed on the first metal layer MTL1 and the step compensator PST. (S300 of FIG. 11)

The photoresist layer PRL may be formed on the upper surface of the first metal layer MTL1 flattened by the step compensator PST. The photoresist layer PRL may be formed of photoresist, which is a type of a photosensitive liquid. The photoresist layer PRL may be formed to be flat on the first valley VAL1.

Fourth, as illustrated in FIG. 15, a photoresist pattern PR may be formed by patterning the photoresist layer PRL. (S400 of FIG. 11)

A portion of the photoresist layer PRL may be removed through exposure and development. Accordingly, the photoresist pattern PR may be formed. For example, the photoresist pattern PR may be formed on the display area DA. For example, the photoresist pattern PR may be located on opposite sides of the thin film transistor TFT. The photoresist pattern PR may not be disposed on the first valley VAL1.

According to the method for manufacturing a display device according to the present embodiment, unlike the method for manufacturing the display device according to the conventional embodiment described with reference to FIGS. 8 to 10, the photoresist layer PRL formed flat on the first valley VAL1 may be completely removed without residue. Accordingly, the photoresist pattern PR may not be disposed on the first valley VAL1.

Fifth, as illustrated in FIG. 16, a touch electrode TEL may be formed by patterning the first metal layer MTL1 using the photoresist pattern PR. (S500 of FIG. 11)

The first metal layer MTL1 may be etched in a region where the photoresist pattern PR is removed. For example, the first metal layer MTL1 or the touch electrode TEL may not be disposed on the first valley VAL1. For example, the upper surface of the second touch insulating layer SIL2 may be exposed in the first valley VAL1. The first metal layer MTL1 overlapping the photoresist pattern PR may not be etched by an etchant so that the touch electrode TEL may be formed. However, a portion of the first metal layer MTL1 overlapping the photoresist pattern PR may be etched by over-etching.

According to the method for manufacturing a display device according to the present embodiment, the step compensator PST may be removed along with etching the first metal layer MTL1. Since the step compensator PST includes the same material as the first metal layer MTL1, in other words, the first metal, the step compensator PST may be etched together with the first metal layer MTL1 by an etchant configured to etch the first metal layer MTL1. Accordingly, since it is not necessary to separately etch the step compensator PST and the first metal layer MTL1, process efficiency can be improved.

After the etching, the photoresist pattern PR may be removed.

Sixth, as illustrated in FIG. 17, a third touch insulating layer SIL3 may be formed on the touch electrode TEL. (S600 of FIG. 11)

The third touch insulating layer SIL3 may be an inorganic film including at least one of a silicon nitride layer, a silicon oxy nitride layer, a silicon oxide layer, a titanium oxide layer, and an aluminum oxide layer. The upper surface of the third touch insulating layer SIL3 may be exposed in the first valley VAL1.

Although the method for manufacturing a display device has been described with reference to the display device 10 according to an embodiment described with reference to FIG. 6, the step compensator PST can be applied in the same way as in the display device 10 according to another embodiment described with reference to FIG. 7.

For example, when the second encapsulation layer TFE2 of the display device 10 is not disposed outside the first dam DAM1 as illustrated in FIG. 7, the step compensator PST may be formed not only in the first valley VAL1 but also in the second valley VAL2. For example, the step compensator PST may be formed in at least one of the first valley VAL1 and the second valley VAL2.

In addition, although the step compensator PST is illustrated to be formed on the first encapsulation layer TFE1, the third encapsulation layer TFE3, the first touch insulating layer SIL1 and the second touch insulating layer SIL2 in FIG. 15, the present disclosure is not limited thereto.

For example, at least one of the first encapsulation layer TFE1, the third encapsulation layer TFE3, the first touch insulating layer SIL1 and the second touch insulating layer SIL2 may not be disposed outside at least one of the first dam DAM1 and the second dam DAM2. In this case, at least one of the first encapsulation layer TFE1, the third encapsulation layer TFE3, the first touch insulating layer SIL1 and the second touch insulating layer SIL2 may not be disposed on at least one of the first valley VAL1 and the second valley VAL2. Accordingly, the step compensator PST may not overlap at least one of the first encapsulation layer TFE1, the third encapsulation layer TFE3, the first touch insulating layer SIL1 and the second touch insulating layer SIL2.

In addition, although the step compensator PST is illustrated to be disposed on the gate insulating layer GI, the first interlayer insulating layer ILD1 and the second interlayer insulating layer ILD2, the present disclosure is not limited thereto.

For example, when at least one of the gate insulating layer GI, the first interlayer insulating layer ILD1 and the second interlayer insulating layer ILD2 does not overlap with at least one of the first valley VAL1 and the second valley VAL2, the step compensator PST may not overlap with at least one of the gate insulating layer GI, the first interlayer insulating layer ILD1 and the second interlayer insulating layer ILD2.

In concluding the detailed description, those skilled in the art will appreciate that many variations and modifications can be made to the embodiments without departing from the scope of the present disclosure. Therefore, the disclosed embodiments of the invention are not for purposes of limitation.

What is claimed is:

1. A method for manufacturing a display device, the display device comprising:

a substrate including a display area and a sub area disposed at a side of the display area;

a plurality of light emitting elements disposed on the substrate in the display area;

a first dam disposed on the substrate and disposed between the plurality of light emitting elements and the sub area;

a bank structure disposed on the substrate and disposed in the sub area; and a first valley disposed between the first dam and the bank structure, wherein the method comprises:

forming a first metal layer including a first metal in the first valley;

forming a step compensator on the first metal layer in the first valley;

forming a photoresist layer on the first metal layer and the step compensator;

forming a photoresist pattern by patterning the photoresist layer; and forming a first electrode by patterning the first metal layer using the photoresist pattern.

2. The method of claim 1, wherein the step compensator includes the first metal.

3. The method of claim 1, wherein, in the forming of the first electrode, the step compensator is removed along with patterning the first metal layer.

4. The method of claim 1, wherein the step compensator is etched by an etchant used to etch the first metal layer.

5. The method of claim 1, wherein, in the forming of the step compensator, upper surfaces of the first metal layer and the step compensator are positioned at the same height.

6. The method of claim 5, wherein, in the forming of the photoresist layer, the photoresist layer is formed to be flat in the first valley.

7. The method of claim 1, wherein, in the forming of the photoresist pattern, the photoresist pattern is not disposed on the first valley.

8. The method of claim 1, wherein, in the forming of the first electrode, the first electrode or the first metal layer is not disposed on the first valley.

9. The method of claim 1, wherein the display device further comprises a thin film encapsulation layer disposed on the plurality of light emitting elements, wherein the thin film encapsulation layer comprises a first encapsulation layer, a second encapsulation layer disposed on the first encapsulation layer, and a third encapsulation layer disposed on the second encapsulation layer, and wherein the second encapsulation layer is not disposed in the first valley.

10. The method of claim 1, a second dam disposed on the substrate and disposed between the first dam and the plurality of light emitting elements; and a second valley disposed between the first dam and the second dam, wherein the step compensator is further formed in the second valley.

11. The method of claim 10, wherein the display device further comprises a thin film encapsulation layer disposed on the plurality of light emitting elements, wherein the thin film encapsulation layer comprises a first encapsulation layer, a second encapsulation layer disposed on the first encapsulation layer, and a third encapsulation layer disposed on the second encapsulation layer, and wherein the second encapsulation layer is not disposed in the second valley.

12. The method of claim 1, wherein the step compensator is formed by applying a paste in a screen printing method.

13. A method for manufacturing a display device, the display device comprising:

a substrate;

a plurality of light emitting elements disposed on the substrate;

a first dam disposed on the substrate and disposed at a side of the plurality of light emitting elements;

a second dam disposed on the substrate and disposed at a side of the first dam; and a valley disposed between the first dam and the second dam, wherein the method comprises:

forming a first metal layer including a first metal in the valley;

forming a step compensator on the first metal layer in the valley;

forming a photoresist layer on the first metal layer and the step compensator;

forming a photoresist pattern by patterning the photoresist layer; and forming a first electrode by patterning the first metal layer using the photoresist pattern.

14. The method of claim 13, wherein the step compensator includes the first metal.

15. The method of claim 13, wherein, in the forming of the first electrode, the step compensator is removed with the patterning of the first metal layer.

16. The method of claim 13, wherein the step compensator is etched by an etchant used to etch the first metal layer.

17. The method of claim 13, wherein, in the forming of the step compensator, upper surfaces of the first metal layer and the step compensator are positioned at the same height.

18. The method of claim 17, wherein, in the forming of the photoresist layer, the photoresist layer is formed to be flat in the valley.

19. The method of claim 13, wherein the photoresist pattern is not disposed in the valley.

20. The method of claim 13, wherein the first electrode or the first metal layer is not disposed in the valley.

* * * * *